(12) United States Patent
Kim et al.

(10) Patent No.: US 10,672,772 B2
(45) Date of Patent: Jun. 2, 2020

(54) SEMICONDUCTOR DEVICE AND METHOD FOR FABRICATING THE SAME

(71) Applicant: SK hynix Inc., Gyeonggi-do (KR)

(72) Inventors: Beom-Yong Kim, Gyeonggi-do (KR); Hun Lee, Gyeonggi-do (KR); Deok-Sin Kil, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 95 days.

(21) Appl. No.: 15/835,629

(22) Filed: Dec. 8, 2017

(65) Prior Publication Data

US 2018/0269211 A1 Sep. 20, 2018

(30) Foreign Application Priority Data

Mar. 17, 2017 (KR) .................. 10-2017-0033829

(51) Int. Cl.
| | | |
|---|---|---|
| *H01L 21/00* | (2006.01) | |
| *H01L 27/108* | (2006.01) | |
| *H01L 21/02* | (2006.01) | |
| *H01L 49/02* | (2006.01) | |
| *H01L 21/311* | (2006.01) | |

(52) U.S. Cl.
CPC ...... *H01L 27/10852* (2013.01); *H01L 21/022* (2013.01); *H01L 21/02178* (2013.01); *H01L 21/02181* (2013.01); *H01L 21/02183* (2013.01); *H01L 21/02186* (2013.01); *H01L 21/02189* (2013.01); *H01L 21/02244* (2013.01); *H01L 21/02252* (2013.01); *H01L 21/02304* (2013.01); *H01L 21/31111* (2013.01); *H01L 27/10814* (2013.01); *H01L 28/91* (2013.01); *H01L 27/10823* (2013.01)

(58) Field of Classification Search
CPC ......... H01L 21/02244; H01L 21/02252; H01L 21/02304; H01L 21/31111; H01L 27/10814; H01L 28/91; H01L 27/10852; H01L 21/02178; H01L 21/02181; H01L 21/02183; H01L 21/02186; H01L 21/02189; H01L 21/022
See application file for complete search history.

(56) References Cited

U.S. PATENT DOCUMENTS

| | | | | |
|---|---|---|---|---|
| 6,180,481 | B1 * | 1/2001 | Deboer | H01L 28/55 257/E21.009 |
| 6,963,103 | B2 * | 11/2005 | Forbes | G11C 7/20 257/315 |
| 7,238,574 | B1 * | 7/2007 | Hong | H01L 29/513 438/261 |
| 8,871,645 | B2 * | 10/2014 | Ganguly | H01L 21/67167 257/E21.209 |
| 2012/0235276 | A1 | 9/2012 | Rui et al. | |
| 2016/0087028 | A1 | 3/2016 | Hirota et al. | |

* cited by examiner

*Primary Examiner* — Richard A Booth
(74) *Attorney, Agent, or Firm* — IP & T Group LLP

(57) ABSTRACT

A method for fabricating semiconductor device includes: forming a bottom electrode of a high aspect ratio; forming an interface layer by sequentially performing a first plasma process and a second plasma process onto a surface of the bottom electrode; forming a dielectric layer over the interface layer; and forming a top electrode over the dielectric layer.

19 Claims, 28 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2017-0033829, filed on Mar. 17, 2017, which is incorporated herein by reference in its entirety.

BACKGROUND

1. Field

Exemplary embodiments of the present invention relate to a semiconductor device and a method for fabricating the same and, more particularly, to a semiconductor device including a capacitor and a method for fabricating the semiconductor device.

2. Description of the Related Art

A memory device such as a Dynamic Random Access Memory (DRAM) may include capacitors. Each capacitor may include a bottom electrode, a dielectric layer, and a top electrode. High surface energy of the bottom electrode may cause oxygen loss from the dielectric layer. The oxygen loss from the dielectric layer may reduce the capacitance of the capacitor and increase leakage current in the capacitor.

SUMMARY

Embodiments of the present invention are directed to an improved semiconductor device including an improved capacitor, and a method for fabricating the semiconductor device having the improved capacitor.

The improved capacitor exhibits low leakage current, improved capacitance, and excellent reliability.

In accordance with an embodiment of the present invention, a method for fabricating a semiconductor device includes: forming a its bottom electrode having a high aspect ratio; forming an interface layer by sequentially performing a first plasma process and a second plasma process onto a surface of the bottom electrode; forming a dielectric layer over the interface layer; and forming a top electrode over the dielectric layer.

The forming of the interface layer may include performing the first plasma process in an ion plasma-dominant atmosphere at a low pressure, and performing the second plasma process in a radical plasma-dominant atmosphere at a high pressure.

The second plasma process may be performed at a higher pressure than at a pressure which the first plasma process performed.

The second plasma process may be performed at a pressure that is higher by approximately 1 Torr, and the first plasma process may be performed at a pressure that is lower than approximately 100 mTorr.

The forming of the interface layer may include performing the first plasma process in a nitrogen ion plasma-dominant atmosphere at a low pressure, and performing the second plasma process in an oxygen radical plasma-dominant atmosphere at a high pressure.

The first plasma process may include a low-pressure plasma nitridation, and the second plasma process may include a high-pressure plasma oxidation.

The bottom electrode may include a cylindrical shape having an aspect ratio of at least approximately 1:10 or higher.

The bottom electrode may include a pillar shape having an aspect ratio of at least approximately 1:10 or higher.

The bottom electrode may include a lower bottom electrode and an upper bottom electrode, and the first plasma process locally may nitrided a surface of the upper bottom electrode, and the second plasma process may oxidize the lower bottom electrode and the nitrided surface of the upper bottom electrode.

The bottom electrode may include a metal nitride.

The bottom electrode may include a titanium nitride or a tantalum nitride.

The interface layer may include a metal oxide.

The interface layer may include a titanium oxide or a tantalum oxide.

The dielectric layer may include ZAZ $ZrO_2/Al_2O_3/ZrO_2$) or HAH $HfO_2/Al_2O_3/HfO_2$).

In accordance with another embodiment of the present invention, a method for fabricating a semiconductor device includes: forming a mold layer over a lower structure; forming an opening by etching the mold layer; forming a bottom electrode including a metal nitride inside the opening; exposing the bottom electrode by removing the mold layer; forming an interface layer over the bottom electrode by sequentially exposing the bottom electrode to a low-pressure plasma nitridation process and a high-pressure plasma oxidation process; forming a dielectric layer over the interface layer; and forming a top electrode over the dielectric layer.

The low-pressure plasma nitridation process may be performed in a nitrogen ion plasma-dominant atmosphere at a low pressure, and the high-pressure plasma oxidation process may be performed in an oxygen radical plasma-dominant atmosphere at a high pressure.

The high-pressure plasma oxidation process may be performed at a pressure that is higher by approximately 1 Torr, and the low-pressure plasma nitridation process may be performed at a pressure that is lower than approximately 100 mTorr.

The bottom electrode may include a cylindrical shape or a pillar shape having an aspect ratio of at least approximately 1:10 or higher.

The bottom electrode may Include a titanium nitride or a tantalum nitride.

The interface layer may include a titanium oxide or a tantalum oxide.

DETAILED DESCRIPTION

Figure 1A:
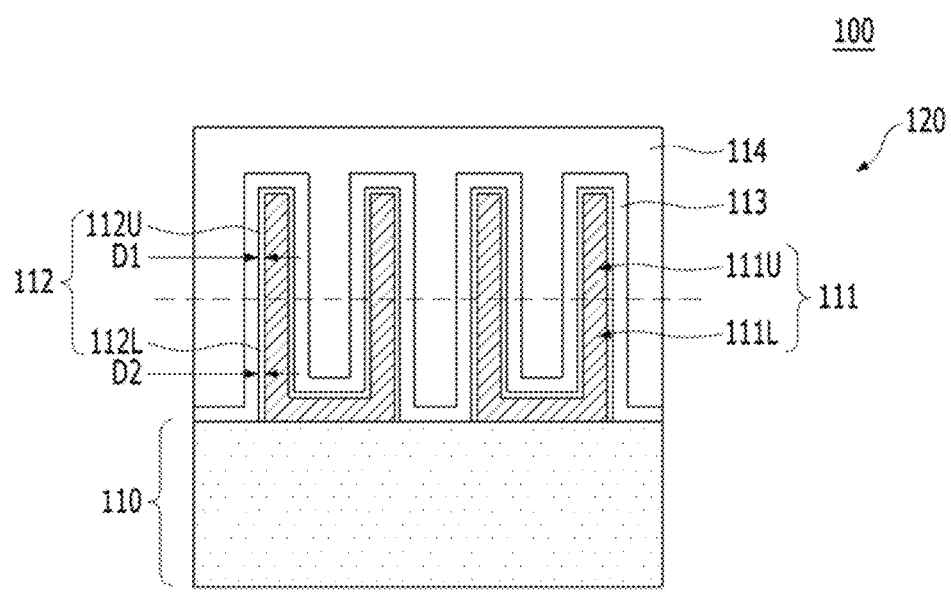
FIG. 1A is a schematic cross-sectional view illustrating a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Referring to the accompanying drawings, the embodiments of the present invention are described in detail, hereafter. To simplify the description, the embodiments of the present invention are described by taking a Dynamic Random Access Memory (DRAM) as an example, but the concept and spirit of the present invention are not limited to a DRAM only, and the technology of the present invention may be applied to other memory devices or semiconductor devices.

FIG. 1A is a simplified cross-sectional view illustrating a semiconductor device 100 in accordance with an embodiment of the present invention.

Referring to FIG. 1A, the semiconductor device 100 may include a lower structure 110 and a capacitor 120 formed on the lower structure 110. The capacitor 120 may include a bottom electrode 111, an interface layer 112, a dielectric layer 113, and a top electrode 114. The interface layer 112, the dielectric layer 113, and the top electrode 114 may be sequentially stacked over the bottom electrode 111.

The bottom electrode 111 may have a high aspect ratio. Herein, the aspect ratio may refer to a ratio of width to height. The high aspect ratio may refer to an aspect ratio that is greater than approximately 1:1. For example, the bottom electrode 111 may have a high aspect ratio of approximately 1:10 or higher. In an example, the bottom electrode 111 may be of a cylindrical shape. In another example, the bottom electrode 111 may be of a pillar shape other than the cylindrical shape. The bottom electrode 111 may be referred to as a storage node. The bottom electrode 111 may be made of a metal material that includes at least one metal element. For example, suitable metal materials for the bottom electrode 111 include a titanium nitride (TiN), a tantalum nitride (TaN), or a combination thereof. As described above, the bottom electrode 111 may include a metal nitride that includes at least one metal element and nitrogen. The metal element may be preferably a transition metal. The bottom electrode 111 may be a metal nitride having a stoichiometric composition ratio. For example, the composition ratio of the metal element and nitrogen may be approximately 1:1. For example, the bottom electrode 111 may be made of a titanium nitride (TiN) or a tantalum nitride (TaN). The bottom electrode 111 may be formed through an Atomic Layer Deposition process (ALD-TiN). The bottom electrode 111 may include a lower portion 111L and an upper portion 111U. Herein, the lower portion 111L and the upper portion 111U are presented for the sake of convenience in description, and the height of the lower portion 111L and the height of the upper portion 111U may be the same or different from each other. Hereafter, the lower portion 111L may be referred to as a lower bottom electrode 111L, and the upper portion 111U may be referred to as an upper bottom electrode 111U. The bottom electrode has a U shape.

The interface layer 112 may be formed conformally over the bottom electrode 111. The interface layer 112 may be made of a metal material which includes the same metal element that is included in the bottom electrode 111. For example, the interface layer 112 may be an oxide of the metal element of the bottom electrode. The interface layer 112 may be formed by oxidizing the surface of the bottom electrode 111. The interface layer 112 may be a metal oxide that includes at least one metal element and oxygen. The interface layer 112 and the bottom electrode 111 may include the same metal element. For example, when the bottom electrode 111 is a titanium nitride, the interface layer 112 may be a titanium oxide. When the bottom electrode 111 is a tantalum nitride, the interface layer 112 may be a tantalum oxide.

The interface layer 112 may be formed by performing a plasma process on the surface of the bottom electrode 111 at least two times. Through the plasma process, the interface layer 112 may be formed to have a uniform thickness over the bottom electrode 111. Although the bottom electrode 111 have a high aspect ratio, the its interface layer 112 may be formed with a uniform thickness. The interface layer 112 may include a first interface layer 112U and a second interface layer 112L based on the position of the bottom electrode 111. The first interface layer 112U may be formed over the upper bottom electrode 111U. The second interface layer 112L may be formed over the lower bottom electrode 111L. The first interface layer 112U and the second interface layer 112L that are formed by performing the plasma process a plurality of times may preferably have the same thickness. The first interface layer 112U may have a first thickness D1, and the second interface layer 112L may have a second thickness D2. The first thickness D1 and the second thickness D2 may be the same. The plasma process that is performed a plurality of times may include a plasma nitridation process and a plasma oxidation process that are performed sequentially. For example, the first interface layer 112U may be formed through the plasma nitridation process and the plasma oxidation process, and the second interface layer 112L may be formed through the plasma oxidation process. A method for forming the interface layer 112 may be described later. Part of the interface layer 112 that is between consecutive bottom electrode layers 111 may be in direct contact with the lower structure 110.

The dielectric layer 113 may be formed over the interface layer 112 to conform to the shape of the interface layer 112. In some embodiments, the dielectric layer 113 may be made of a high-k material. The dielectric layer 113 may have a higher dielectric constant than that of a silicon oxide. Suitable, high-k materials may include a hafnium oxide ($HfO_2$), a zirconium oxide ($ZrO_2$), an aluminum oxide ($Al_2O_3$), a titanium oxide ($TiO_2$), a tantalum oxide ($Ta_2O_5$), a niobium oxide ($Nb_2O_5$), or a strontium titanium oxide ($SrTiO_3$). The dielectric layer 113 may be formed in a single layer or may be formed as a composite layer that includes two or more layers of the aforementioned high-k materials.

A top electrode 114 may be formed over the dielectric layer 113. The top electrode 114 may be made of a metal-based material. For example, the top electrode 114 may be made of titanium (Ti) titanium nitride (TiN), tantalum (Ta), a tantalum nitride (TaN), a titanium aluminum nitride (TiAlN), tungsten (W), a tungsten nitride (WN), ruthenium (Ru), a ruthenium oxide ($RuO_2$), iridium (Ir), an iridium oxide ($IrO_2$) platinum (Pt), or a combination thereof. In an embodiment, the top electrode 114 may be made of a titanium nitride. The top electrode 114 may be formed through an Atomic Layer Deposition process (ALD-TiN). For example, in an embodiment the top electrode 114 may be made of titanium nitride formed through the ALD-TiN process. The top electrode 114 may include a material including the same material as that of the bottom electrode 111.

The top electrode 114 may have a single-layer or a multi-layer structure. In a multi-layer structure, the top electrode 114 may be formed by sequentially stacking a first metal-containing layer, a silicon germanium layer, and a second metal-containing layer. Suitable first metal-containing and second metal-containing layers may include titanium (Ti), a titanium nitride (TiN), tantalum (Ta), a tantalum nitride (TaN), a titanium aluminum nitride (TAM), tungsten (W), a tungsten nitride (WN), ruthenium (Ru), a ruthenium oxide ($RuO_2$), iridium (Ir), an iridium oxide ($IrO_2$), platinum (Pt), or a combination thereof. For example, the first metal-containing layer may be a tantalum nitride (TaN), and the second metal-containing layer may be tungsten nitride layer/ tungsten layer (WN/W) where a tungsten nitride (WN) and tungsten (W) are stacked. The silicon germanium layer may be doped with a dopant such as, for example, boron. The dielectric layer 114 may have a flat top surface.

In some embodiments, the dielectric layer 113 may be formed of a zirconium oxide-based material having excellent leakage current characteristics while sufficiently decreasing an equivalent-oxide thickness (EOT). For example, the dielectric layer 113 may be made of ZAZ ($ZrO_2/Al_2O_3/ZrO_2$). Alternatively, the dielectric layer 113 may be made of HAH ($HfO_2/Al_2O_3/HfO_2$).

Figure 1B:
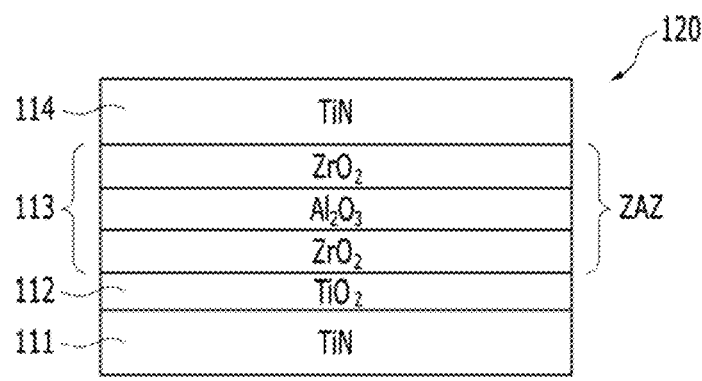
FIGS. 1B and 1C are schematic cross-sectional views illustrating a semiconductor device in accordance with a modified example of an embodiment of the present invention.
Figure 1C:
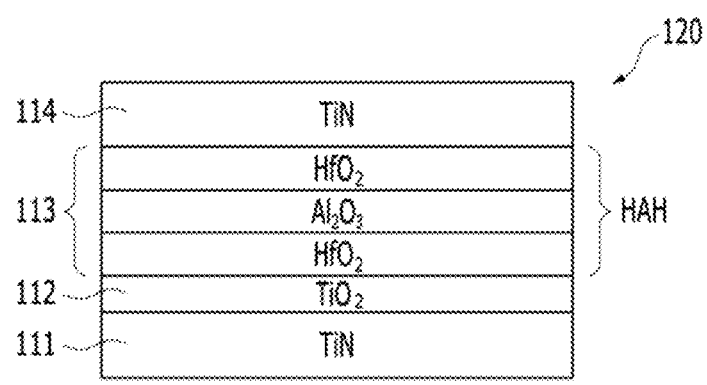

FIGS. 1B and 1C illustrate the capacitor 120 of a semiconductor device in accordance with a modified example of an embodiment of the present invention.

Referring to FIG. 1B, when the interface layer 112 includes a titanium oxide ($TiO_2$) and the dielectric layer 113 includes ZAZ ($ZrO_2/Al_2O_3/ZrO_2$), a dielectric layer stack formed of TZAZ ($TiO_2/ZrO_2/Al_2O_3/ZrO_2$) may be formed over the bottom electrode 111.

Referring to FIG. 1C, when the interface layer 112 includes a titanium oxide ($TiO_2$) and the dielectric layer 113 includes HAH ($HfO_2/Al_2O_3/HfO_2$), a dielectric layer stack formed of THAH ($TiO_2/HfO_2/Al_2O_3/HfO_2$) may be formed over the bottom electrode 111.

In this way, the capacitance of the capacitor 120 may be increased by the stack of the interface layer 112 and the dielectric layer 113. The capacitance may be increased even more by using the interface layer 112 and thereby suppressing oxygen loss from the dielectric layer 113.

Figure 1D:
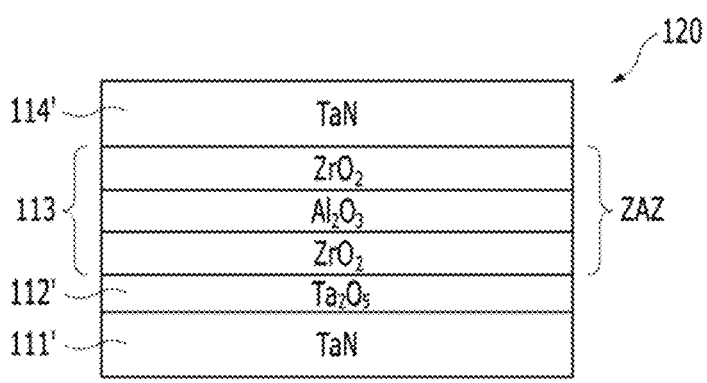
FIGS. 1D and 1E illustrate a semiconductor device in accordance with another modified example of an embodiment of the present invention.
Figure 1E:
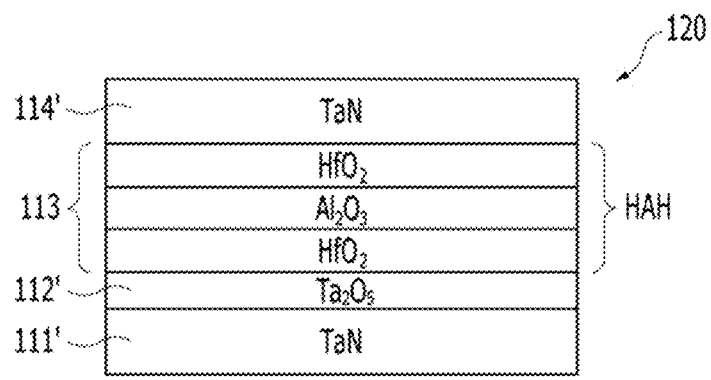

FIGS. 1D and 1E are simplified cross-sectional views illustrating the capacitor 120 of a semiconductor device in accordance with another modified example of an embodiment of the present invention. In the modified example e of FIGS. 1D and 1E, a bottom electrode 111' and a top electrode 114' may include a tantalum nitride (TaN).

In some embodiments, the bottom electrode 111' may include a tantalum nitride (TaN), and the top electrode 114 may include a titanium nitride (TiN). The interface layer 112' may include a tantalum oxide ($Ta_2O_5$).

Referring to FIG. 1D, when the interface layer 112' includes a tantalum oxide ($Ta_2O_5$) and the dielectric layer 113 includes ZAZ ($ZrO_2/Al_2O_3/ZrO_2$), a dielectric layer stack formed of TZAZ ($Ta_2O_5/ZrO_2/Al_2O_3/ZrO_2$) may be formed over the bottom electrode 111.

Referring to FIG. 1E, when the interface layer 112' includes a tantalum oxide ($Ta_2O_5$) and the dielectric layer 113 includes HAH ($HfO_2/Al_2O_3/HfO_2$), a dielectric layer stack formed of THAH ($Ta_2O_5/HfO_2/Al_2O_3/HfO$) may be formed over the bottom electrode 111'.

FIGS. 2A to 2E are simplified cross-sectional views illustrating a method for forming the interface layer 112 shown in FIG. 1A in accordance with an embodiment of the present invention.

Figure 2A:
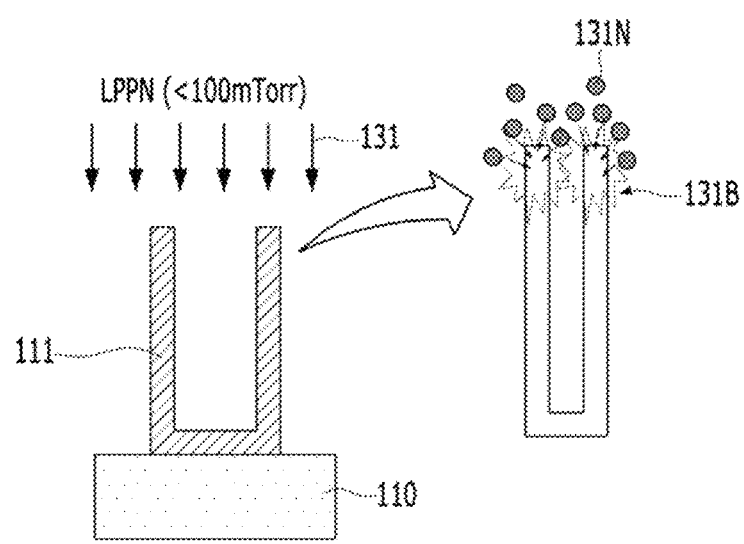
FIGS. 2A to 2E are schematic cross-sectional views describing a method for forming an interface layer shown in FIG. 1A in accordance with an embodiment of the present invention.

Referring to FIG. 2A, the bottom electrode 111 may be formed over the lower structure 110. The bottom electrode 111 may include a titanium nitride.

The bottom electrode 111 may be exposed to a first plasma process 131. The first plasma process 131 may be performed at a low pressure. As the first plasma process 131 is performed in a low-temperature condition, a great deal of nitrogen ion plasma 131N may be formed. Herein, to increase the efficiency of the nitrogen ion plasma 131N, an additive gas may be added. Non-limiting examples of the additive gas may include argon (Ar) or helium (He).

The first plasma process 131 may include a low-pressure plasma nitridation (LPPN). The first plasma process 131 may be performed in the atmosphere of a nitrogen-containing gas at a low pressure. For example, the first plasma process 131 may be performed using a nitrogen gas (N$_2$) or an ammonia (NH$_3$) gas at a pressure of approximately 100 mTorr or lower.

In some embodiments, when the first plasma process 131 is performed in the atmosphere of nitrogen at a low pressure, the highly reactive nitrogen ion plasma 131N may be bombarded 131B into the upper portion of the bottom electrode 111. As described above, the first plasma process 131 may be performed at a low pressure in the atmosphere where the nitrogen ion plasma 131N is dominant.

Figure 2B:
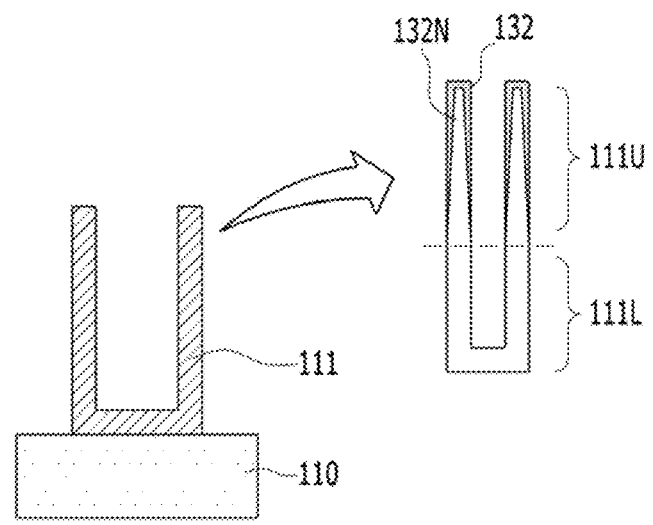

Referring to FIG. 2B, as a result of the first plasma process 131, a nitrogen-rich layer 132 may be formed. For example, when the bottom electrode 111 is formed of a titanium nitride, the nitrogen-rich layer 132 may include a nitrogen-rich titanium nitride (N-rich Ti$_x$N$_y$). The upper portion of the bottom electrode 111 may not be completely transformed into the nitrogen-rich layer 132. The bottom electrode 111 may include the lower bottom electrode 111L and the upper bottom electrode 111U. The upper bottom electrode 111U may include the nitrogen-rich layer 132 and a non-plasma processed portion 132N. The non-plasma processed portion 132N may be defined as located inside of the upper bottom electrode 111U, and the nitrogen-rich layer 132 may be defined as a surface of the upper bottom electrode 111U. The nitrogen-rich layer 132 may have a form of covering the non-plasma processed portion 132N. The lower bottom electrode 111L is not affected by the plasma process. In short, the lower bottom electrode 111L does not include the nitrogen-rich layer 132.

The nitrogen-rich layer 132 is locally formed in the upper bottom electrode 111U through the first plasma process 131. Hence, due to the nitrogen-rich layer 132, the bottom electrode 111 may have an ununiform nitrogen profile. The lower bottom electrode 111L may remain as a titanium nitride, and the upper bottom electrode 111U may include a titanium nitride and a nitrogen-rich titanium nitride that are mixed together. Therefore, the lower bottom electrode 111L may be of a titanium nitride having a stoichiometric composition ratio, and the upper bottom electrode 111U may be of a nitrogen-rich titanium nitride.

As described above, the upper bottom electrode 111U and the lower bottom electrode 111L may be formed of a titanium nitride having different nitrogen content. The lower bottom electrode 111L may be formed of a titanium nitride having a stoichiometric composition ratio, and the upper bottom electrode 111U may be formed of a nitrogen-rich titanium nitride.

Figure 2C:
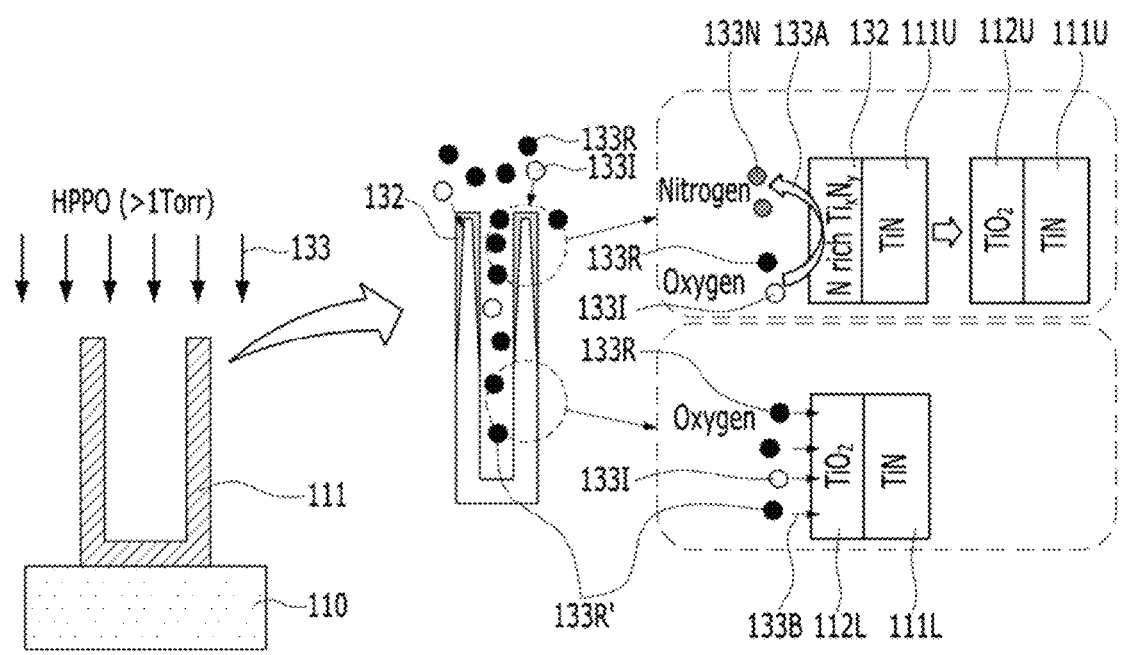

Referring to FIG. 2C, the bottom electrode 111 where the nitrogen-rich layer 132 is formed may be exposed to a second plasma process 133. The second plasma process 133 may be performed at a higher pressure than that the first plasma process 131. For example, the second plasma process 133 may be performed at a pressure that is higher by approximately 1 torr. The second plasma process 133 may be performed in the atmosphere of oxygen. The second plasma process 133 may include a high-pressure plasma oxidation (HPPO).

Oxygen ion plasma readily loses energy at a high pressure. Therefore, the amount of the oxygen ion plasma 133I may be decreased, and oxygen radical plasma 133R may remain to be dominant. Differently from the oxygen ion plasma 133I, the oxygen radical plasma 133R is neutral species, which is advantageous for uniform oxidation. As described above, the second plasma process 133 may be performed at a high pressure in the atmosphere where the oxygen radical plasma 133R is dominant.

Despite the fact, the highly reactive oxygen ion plasma 133I may still remain in a minute amount. Since oxygen plasma particles 133R/133I are implanted into the upper bottom electrode 111U, the oxygen plasma particles may contact the upper bottom electrode 111U more than the lower bottom electrode 111L.

Since the nitrogen-rich layer 132 exists in the upper bottom electrode 111U, reduction may occur prior to oxidation in the upper bottom electrode 111U. In other words, as nitrogen 133N of the nitrogen-rich layer 132 is substituted with oxygen, oxidation of TiN is delayed. While the oxidation of TiN is delayed a downwardly oxygen radical plasma 133R' may reach the lower bottom electrode 111L.

Figure 2D:
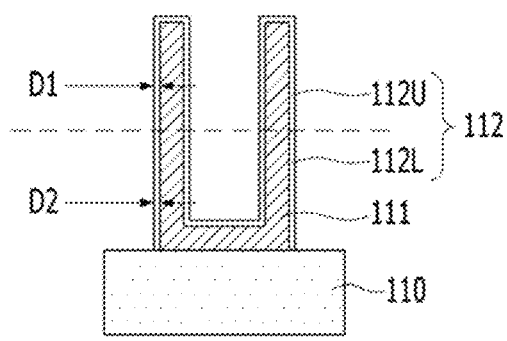

Through the second plasma process 133, as illustrated in FIG. 2D, the first interface layer 112U may be formed over the upper bottom electrode 111U, and the second interface layer 112L may be formed over the lower bottom electrode 111L. Referring to FIG. 2C and FIG. 2D, the first interface layer 112U is formed in the upper bottom electrode 111U through a nitrogen reduction reaction/an oxygen substitution reaction 133A as shown in FIG. 2C. In other words, the first interface layer 112U may be formed by a substitution reaction 133A of the oxygen plasma particles 133I/133R to the nitrogen atoms 133N of the nitrogen-rich layer 132. The second interface layer 112L is formed in the lower bottom electrode 111L through an oxidation reaction 133B. The first interface layer 112U may have a first thickness D1, and the second interface layer 112L may have a second thickness D2. The first thickness D1 and the second thickness D2 may be the same.

The first interface layer 112U and the second interface layer 112L may be formed based on the following principle. Herein, it is assumed that the bottom electrode 111 is formed of a titanium nitride (TiN) In the upper bottom electrode 111U, the nitrogen of the nitrogen-rich layer 132, which is a nitrogen-rich titanium nitride (N-rich Ti$_x$N$_y$) is substituted with oxygen. Therefore, when the nitrogen-rich layer 132 is reduced, a titanium oxide (TiO$_2$) may be formed as the first interface layer 112U. In the lower bottom electrode 111L, the titanium nitride is oxidized through the oxidation reaction 133B, and a titanium oxide (TiO$_2$) may be formed as the second interface layer 112L.

By sequentially performing a series of processes, which includes the low-pressure first plasma process 131 and the high-pressure second plasma process 133, the interface layer 112 having a uniform thickness can be formed on the surface of the bottom electrode 111. The interface layer 112 may include the first interface layer 112U and the second interface layer 112L. The first interface layer 112U and the second interface layer 112L may include an oxide. The first interface layer 112U and the second interface layer 112L may be of an oxide that includes the metal element of the bottom electrode 111. For example, when the bottom electrode 111 is of a titanium nitride, the first interface layer 112U and the second interface layer 112L may include a titanium oxide (TiO$_2$).

Figure 3A:
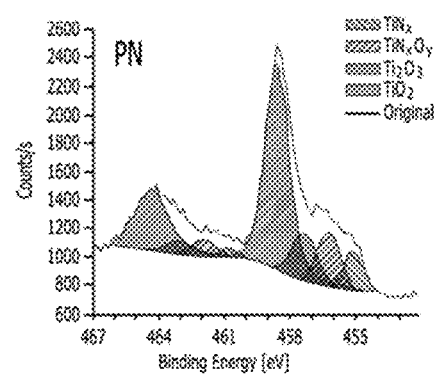
FIGS. 3A and 3B are diagrams illustrating X-ray Photo-electron Spectroscopy (XPS) analysis results of the chemical states of a surface nitridated TiN surface and a surface oxidized TiN surface.
Figure 3B:
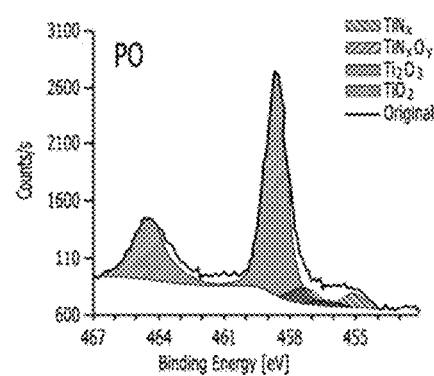

FIGS. 3A and 3B illustrate X-ray Photoelectron Spectroscopy (XPS) analysis results of the chemical states of a surface nitridated TiN surface and a surface oxidized TiN surface.

After the plasma nitridation, there may be diverse non-stoichiometric components. Non-limiting examples of the stoichiometric components may include TiO$_x$N$_y$, TiO$_x$, Ti$_2$O$_3$, TiN$_x$, and the like. Conversely, when a plasma oxidation is performed, it may be seen that sub-phase components may be decreased while titanium oxide (TiO$_2$) component is increased. In short, when nitrogen is substituted with oxygen, a titanium oxide ($TiO_2$) with excellent film quality may be formed. This is because Gibb's free energy ($|\Delta G|$) of a Ti—O bond is greater than that of a Ti—N bond in the substitution reaction in terms of thermodynamics.

Figure 2E:
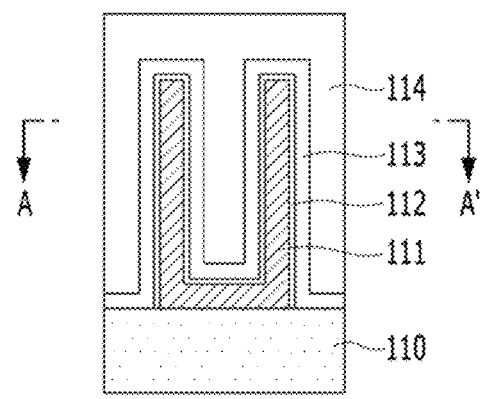

Referring to FIG. 2E, the dielectric layer 113 and the top electrode 114 may be formed over the bottom electrode 111 where the interface layer 112 having the uniform thickness is formed.

Figure 3C:
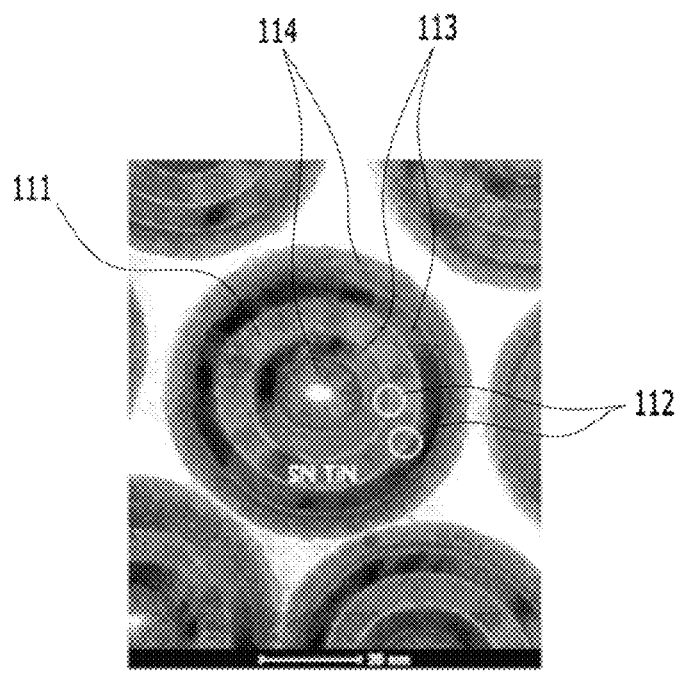
FIG. 3C is a diagram illustrating a Transmission Electron Microscopic (TEM) photograph of a capacitor shown in FIG. 2E taken along a line A-A'.

FIG. 3C is a Transmission Electron Microscopic (TEM) photograph of a capacitor in FIG. 2E taken along a line A-A'. FIG. 3C shows a thin interface layer 112 is formed in a uniform thickness on the surface of the bottom electrode 111.

When the interface layer 112 is thick, the total capacitance of the capacitor may be rather decreased. Therefore, the interface layer 112 may be formed thin in a thickness of approximately 2 nm or less. For controlling the thickness of the interface layer 112 to be thin, a plasma oxidation may be advantageous over a thermal oxidation. Also, to form the interface layer 112 in a uniform thickness in the upper and lower portions of the bottom electrode 111, a low-pressure plasma nitridation and a high-pressure plasma oxidation may be performed sequentially.

Figure 4A:
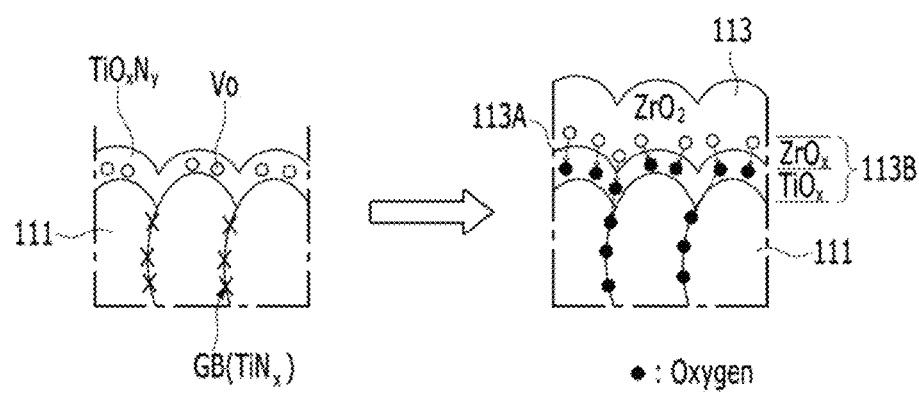
FIGS. 4A to 4C are diagrams illustrating comparative examples where a plasma oxidation is performed independently.
Figure 4B:
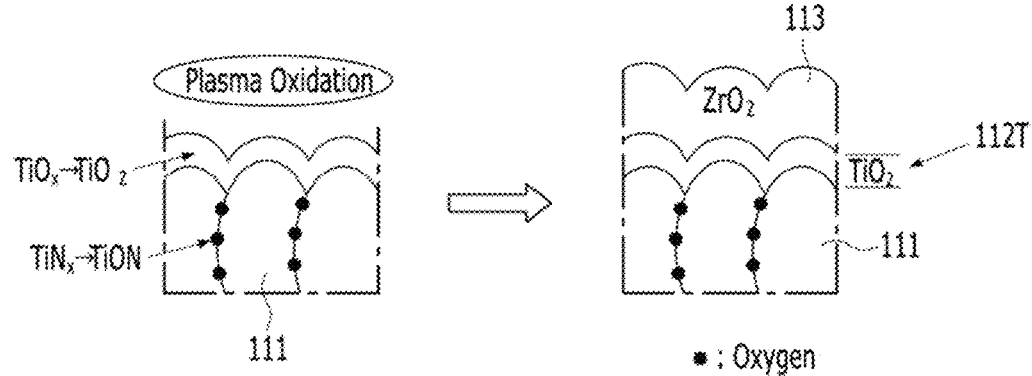
Figure 4C:
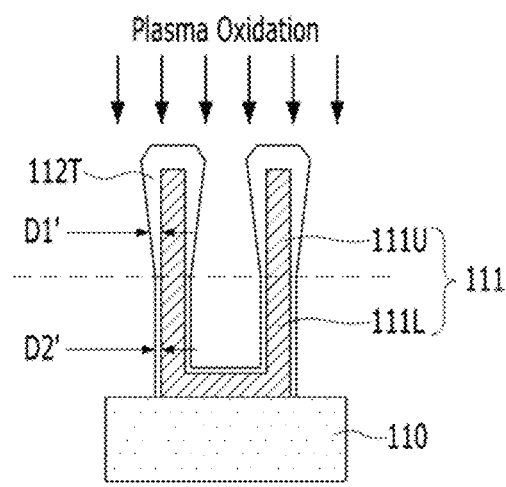

FIGS. 4A to 4C illustrate comparative examples where a plasma oxidation is performed independently.

Referring to FIG. 4A, the bottom electrode 111 and the dielectric layer 113 may be formed. The bottom electrode 111 may include a titanium nitride ($TiN_x$), and the dielectric layer 113 may include a zirconium oxide ($ZrO_2$).

There may be a plurality of surface defects on the surface of the bottom electrode 111. In other words, there may be defects that deprive oxygen from the dielectric layer 113.

The bottom electrode 111 may have a columnar structure. Therefore, the bottom electrode 111 may include a plurality of grain boundaries GB. A titanium nitride (TiN) that is applied as the bottom electrode 111 may have a high crystallinity, and may be grown into a columnar structure. A titanium nitride of a columnar structure may include a plurality of instable grain boundaries GB, i.e., $TiN_x$. As a result, since the surface energy is high, it is possible to deprive oxygen from the subsequent dielectric layer 113.

A natural oxide ($TiO_xN_y$), which exists on the surface of the bottom electrode 111, may also have many oxygen vacancies Vo, and thus it is possible to deprive oxygen from the dielectric layer 113 (refer to a reference numeral '113A').

There may be a non-stoichiometric compound on the interface between the bottom electrode 111 and the dielectric layer 113. For example, there may be $TiO_xN_y$, $TiO_x$, $TiN_x$ and the like. Since the non-stoichiometric compound has a strong power of drawing in oxygen, it may cause oxygen loss of the dielectric layer 113.

The oxygen loss of the dielectric layer 113 may cause parasitic capacitance 113B. For example, the oxygen loss of the dielectric layer 113 may cause parasitic capacitance 113B of a zirconium oxide ($ZrO_x$) and a titanium oxide ($TiO_x$). The oxygen loss of the dielectric layer 113 may decrease the capacitance of the dielectric layer 113 and increase leakage current in the capacitor.

To suppress the oxygen loss of the dielectric layer 113 the surface of the bottom electrode 111 is oxidized. However, if the surface of the bottom electrode 111 is excessively oxidized, a thick oxide may be formed that may decrease the capacitance of the capacitor. Therefore, it is important to control the thickness of the oxide to be thin.

Referring to FIG. 4B, when a plasma oxidation is performed independently, the surface defects of the bottom electrode 111 may be removed so as to suppress the oxygen loss of the dielectric layer 113.

For example, oxygen may pre-occupy the grain boundaries GB of a titanium nitride (TiN) to form a stable titanium oxynitride (TiON) ($TiN_x \rightarrow TiON$), and when the nitrogen is substituted on the surface of the titanium nitride (TiN), a titanium oxide ($TiO_2$) may be formed ($TiO_x \rightarrow TiO_2$).

Through the plasma oxidation, which is described above, an interface layer 112T can be formed on the surface of the bottom electrode 111. After all, the formation of $ZrO_x$ and $TiO_x$ may be suppressed through the plasma oxidation so as to increase the total capacitance of the capacitor and decrease leakage current in the capacitor.

However, when the plasma oxidation is performed alone, it is difficult to form the interface layer 112T having a uniform thickness in the upper and lower portions of the bottom electrode 111.

As scaling of a DRAM continues, the complexity of the process for forming a capacitor is increased drastically. To be specific, the aspect ratio of the bottom electrode 11 may be increased, and as an inlet through which a source gas is inputted becomes narrow, it is difficult to maintain the upper bottom electrode 111U and the lower bottom electrode 111L in a uniform status.

Referring to FIG. 4C, when a surface oxidation is performed through a plasma oxidation process, a thick oxide D1' may be formed over the upper bottom electrode 111U and a thin oxide D2' may be formed over the lower bottom electrode 111L because the lower bottom electrode 111L is not oxidized very well.

Due to the ununiformity in the thickness of the oxide, capacitance may be rather decreased. Also, the bottom electrode 111 may collapse due to the thick oxide D1' that is formed over the upper bottom electrode 111U, which is problematic.

Differently from the comparative example, in the embodiment of the present invention, the interface layer 112 may be formed uniformly on the surface of the bottom electrode 111 having a high aspect ratio by combining the low-pressure plasma nitridation and the high-pressure plasma oxidation, as illustrated in FIGS. 2A to 2E. With the interface layer 112, capacitance of a capacitor may be improved and the leakage current in a capacitor may be decreased as well as forming a capacitor having excellent reliability.

According to another comparative example, a plasma nitridation may be performed alone. In this case, it is difficult to suppress the loss of oxygen from the dielectric layer 113.

The bottom electrode 111' illustrated in FIGS. 1D and 1E may include a tantalum nitride (TaN). The use of a tantalum nitride (TaN) may be advantageous for decreasing leakage current because a tantalum nitride (TaN) has a high work function, compared with a titanium nitride (TiN). Also, with a high film density, it is possible to form a stable structure. When the bottom electrode 111' is of a tantalum nitride (TaN) the interface layer 112' may include a tantalum oxide ($Ta_2O_5$).

Figure 5:
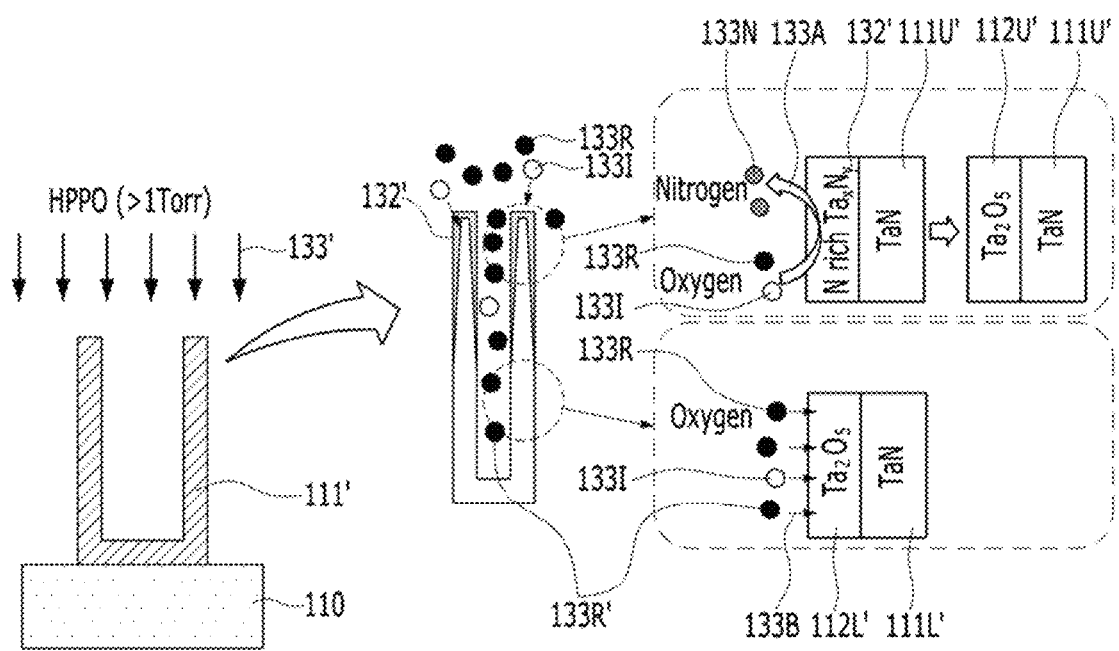
FIG. 5 a diagram illustrating a method for forming a tantalum oxide on the surface of a tantalum nitride bottom electrode.

FIG. 5 illustrates a method for forming a tantalum oxide on the surface of a tantalum nitride bottom electrode.

Referring to FIG. 5, the tantalum nitride bottom electrode 111' may be exposed to the low-pressure first plasma process 131 of FIG. 2A. As a result, a nitrogen-rich layer 132' is locally formed over the upper bottom electrode 111U' of the tantalum nitride bottom electrode 111'. The nitrogen-rich layer 132' may be of a nitrogen-rich tantalum nitride (N-rich $Ta_xN$).

The tantalum nitride bottom electrode 111' where the nitrogen-rich layer 132' is formed may be exposed to a high-pressure second plasma process 133'. The high-pressure second plasma process 133' may be the same as the high-pressure second plasma process 133 of FIG. 2C. As a result, a first interface layer 112U' may be formed over the upper bottom electrode 111U' of the tantalum nitride bottom electrode 111', and a second interface layer 112L' may be formed over the lower bottom electrode 111L' of the tantalum nitride bottom electrode 111'. The first interface layer 112U' may be formed over the upper bottom electrode 111U' of the tantalum nitride bottom electrode 111' through a nitrogen reduction reaction/an oxygen substitution reaction 133A.

The second interface layer 112L' may be formed over the lower bottom electrode 111L' of the tantalum nitride bottom electrode 111' through an oxidation reaction 133B. The first interface layer 112U' and the second interface layer 112L' may preferably have the same thickness. The first interface layer 112U' and the second interface layer 112L' may be of a tantalum oxide ($Ta_2O_5$). As for the principle that the first interface layer 112U' and the second interface layer 112L' are formed, FIG. 2C and the description of FIG. 2C may be referred to.

Figure 6:
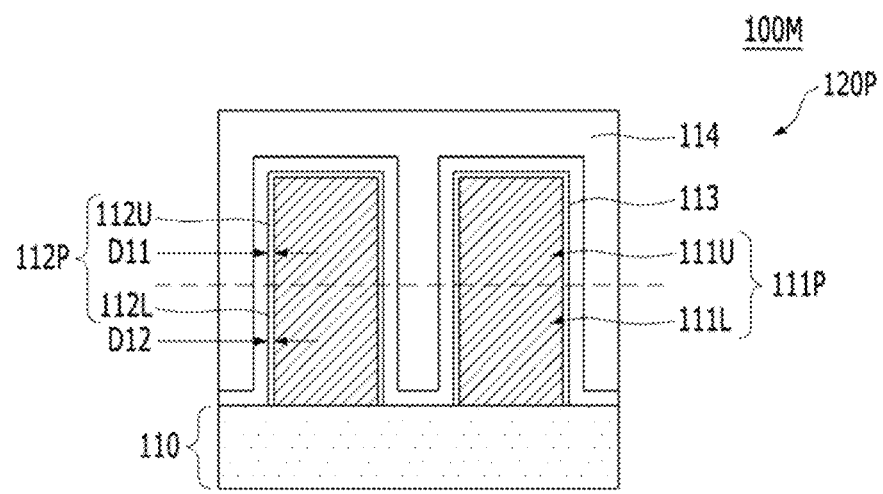
FIG. 6 is a cross-sectional view illustrating a semiconductor device in accordance with an embodiment of the present invention.

FIG. 6 is illustrates a semiconductor device 100M in accordance with an embodiment of the present invention.

Referring to FIG. 6, the semiconductor device 100M may include a lower structure 110 and a capacitor 120P. The capacitor 120P may include a bottom electrode 111P an interface layer 112P, a dielectric layer 113, and a top electrode 114. The interface layer 112P, the dielectric layer 113, and the top electrode 114 may be sequentially stacked over the bottom electrode 111P.

The bottom electrode 111P may have a high aspect ratio. Herein, the aspect ratio may refer to a ratio of width to height thereof. The high aspect ratio of the bottom electrode 111 may refer to an aspect ratio that is greater than approximately 1:1. For example, the bottom electrode 111P may have a high aspect ratio of approximately 1:10 or higher. The bottom electrode 111P may be of a pillar shape. The bottom electrode 111P may be referred to as a storage node. The bottom electrode 111P may be made of a metal material that includes at least one metal element. For example, the bottom electrode 111P may be made of a titanium nitride (TiN), a tantalum nitride (TaN), or a combination thereof. As described above, the bottom electrode 111P may be made of a metal nitride that includes at least one metal element and nitrogen. The bottom electrode 111P may be a metal nitride having a stoichiometric composition ratio. For example, the composition ratio of the metal element and nitrogen may be approximately 1:1. In this embodiment, the bottom electrode 111P may include a titanium nitride or a tantalum nitride. For example, the bottom electrode 111P may include a titanium nitride that is formed through an Atomic Layer Deposition process (ALD-TiN). The bottom electrode 111P may include a lower bottom electrode 111L and an upper bottom electrode 111U.

The interface layer 112P may be formed over the bottom electrode 111P. The interface layer 112P may include the metal element that is included in the bottom electrode 111P. For example, the interface layer 112P may be an oxide of the metal element. The interface layer 112P may be an oxide obtained by oxidizing the bottom electrode 111P. The interface layer 112P may be a metal oxide that includes at least one metal element and oxygen. The interface layer 112P and the bottom electrode 111P may include the same metal element. When the bottom electrode 111P is a titanium nitride, the interface layer 112P may be a titanium oxide.

When the bottom electrode 111P is a tantalum nitride, the interface layer 112P may be a tantalum oxide.

The interface layer 112P may be formed by performing a plasma process at least two times, as illustrated in FIGS. 2A and 2C. Through the plasma process, the interface layer 112P may have a uniform thickness. The interface layer 112P may be formed over the bottom electrode 111P having a high aspect ratio in a uniform thickness. The interface layer 112P may include a first interface layer 112U and a second interface layer 112L based on the position of the bottom electrode 111P. The first interface layer 112U may be formed over the upper bottom electrode 111U. The second interface layer 112L may be formed over the lower bottom electrode 111L. The first interface layer 112U and the second interface layer 112L that are formed by performing the plasma process a plurality of times may preferably have the same thickness. The first interface layer 112U may have a first thickness D11, and the second interface layer 112L may have a second thickness D12. The first thickness D11 and the second thickness 112 may be the same. The plasma process that is performed a plurality of times may include a plasma nitridation process and a plasma oxidation process that are performed sequentially.

The dielectric layer 113 may be formed over the interface layer 112P. The dielectric layer 113 may be made of a high-k material whose dielectric rate is higher than a silicon oxide. The high-k material may include a hafnium oxide ($HfO_2$), a zirconium oxide ($ZrO_2$), an aluminum oxide ($Al_2O_3$), a titanium oxide ($TiO_2$), a tantalum oxide ($Ta_2O_5$), a niobium oxide ($Nb_2O_5$), or a strontium titanium oxide ($SrTiO_3$). Alternatively, the dielectric layer 113 may be formed of a composite layer that includes two or more layers of the aforementioned high-k materials.

A top electrode 114 may be formed over the dielectric layer 113. The top electrode 114 may be made of a metal-based material. For example, the top electrode 114 may include titanium (Ti), a titanium nitride (TiN), tantalum (Ta), a tantalum nitride (TaN), a titanium aluminum nitride (TiAlN), tungsten (W), a tungsten nitride (WN), ruthenium (Ru), a ruthenium oxide ($RuO_2$), iridium (Ir), an iridium oxide ($IrO_2$), platinum (Pt), or a combination thereof. In some embodiments, the top electrode 114 may include a titanium nitride that is formed through an Atomic Layer Deposition process (ALD-TiN). The top electrode 114 may include a material including the same material as that of the bottom electrode 111P.

Alternatively, the top electrode 114 may have a multi-layer structure. The top electrode 114 may be formed by sequentially stacking a first metal-containing layer, a silicon germanium layer, and a second metal-containing layer. The first metal-containing layer and the second metal-containing layer may include titanium (Ti), a titanium nitride (TiN), tantalum (Ta), a tantalum nitride (TaN), a titanium aluminum nitride (TiAlN), tungsten (W), a tungsten nitride (WN), ruthenium (Ru), a ruthenium oxide ($RuO_2$), iridium (Ir), an iridium oxide ($IrO_2$), platinum (Pt), or a combination thereof. For example, the first metal-containing layer may be a tantalum nitride (TaN), and the second metal-containing layer may be WN/W where a tungsten nitride (WN) and tungsten (W) are stacked. The silicon germanium layer may be doped with a suitable dopant, such as, for example, boron. In some embodiments, the dielectric layer 113 may be formed of a zirconium oxide-based material having excellent leakage current characteristics while sufficiently decreasing an equivalent-oxide thickness (EOT). For example, the dielectric layer 113 may include ZAZ ($ZrO_2$/

Al$_2$O$_3$/ZrO$_2$). Alternatively, the dielectric layer 113 may include HAH (HfO$_2$/Al$_2$O$_3$/HfO$_2$).

The dielectric layer 113 may include the multi-layer dielectric layer illustrated in FIGS. 1B to 1E.

FIGS. 7A to 7D illustrate an example of a method for forming an interface layer 113 shown in FIG. 6.

Figure 7A:
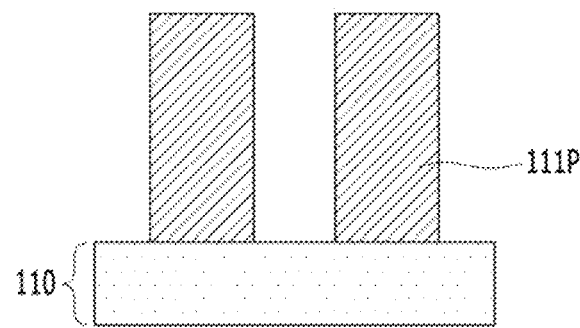
FIGS. 7A to 7D are cross-sectional views illustrating an example of a method for forming an interface layer shown in FIG. 6.

Referring to FIG. 7A, the bottom electrode 111P may be formed over the lower structure 110. The bottom electrode 111P may include a titanium nitride. The bottom electrode 111P may have a columnar crystal structure. For example, the bottom electrode 111P may have a pillar shape.

Figure 7B:
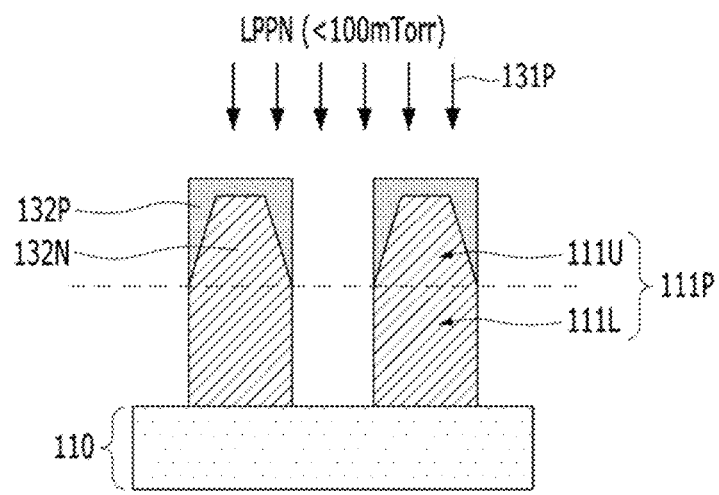

Referring to FIG. 7B, the bottom electrode 111P may be exposed to a first plasma process 131P. The first plasma process 131P may be performed in the same way that the first plasma process 131 of FIG. 2A is performed. The first plasma process 131P may be performed at a low pressure. The first plasma process 131P may include a low-pressure plasma nitridation (LPPN). The first plasma process 131P may be performed in the atmosphere of a nitrogen-containing gas at a low pressure. For example, the first plasma process 131P may be performed using a nitrogen gas (N$_2$) or an ammonia (NH$_3$) gas at a pressure of approximately 100 mTorr or lower.

In some embodiments, when the first plasma process 131P is performed in the atmosphere of nitrogen at a low pressure, a nitrogen-rich layer 132P may be formed. For example, when the bottom electrode 111P is formed of a titanium nitride, the nitrogen-rich layer 132P may include a nitrogen-rich titanium nitride (N-rich Ti$_x$N$_y$). The upper portion of the bottom electrode 111P may not be completely transformed into the nitrogen-rich layer 132P. The bottom electrode 111P may include the lower bottom electrode 111L and the upper bottom electrode 111U. The upper bottom electrode 111U may include the nitrogen-rich layer 132P and a non-plasma processed portion 132N. The non-plasma processed portion 132N may be defined as an inside of the upper bottom electrode 111U, and the nitrogen-rich layer 132P may be defined as a surface of the upper bottom electrode 111U. The lower bottom electrode 111L is not affected by the plasma process. In short, the lower bottom electrode 111L may not include the nitrogen-rich layer 132P.

The nitrogen-rich layer 132P is locally formed in the upper bottom electrode 111U through the first plasma process 131P. Due to the nitrogen-rich layer 132P, the bottom electrode 111P may have an ununiform nitrogen profile. The lower bottom electrode 111L may remain as a titanium nitride, and the upper bottom electrode 111U may include a titanium nitride and a nitrogen-rich titanium nitride that are mixed together. Therefore, the upper bottom electrode 111U and the lower bottom electrode 111L may include a titanium nitride of different nitrogen contents.

Figure 7C:
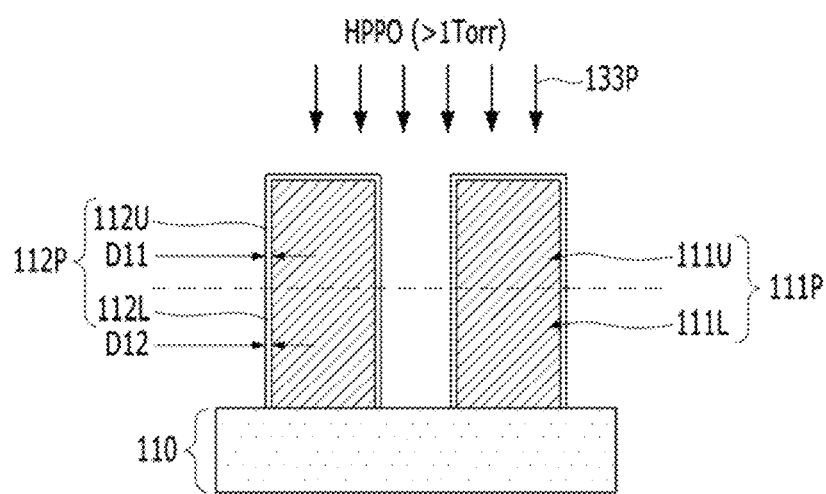

Referring to FIG. 7C, the bottom electrode 111P where the nitrogen-rich layer 132P is formed may be exposed to a second plasma process 133P. The second plasma process 133P may be performed the same as the second plasma process 133 of FIG. 2C. The second plasma process 133P may be performed at a higher pressure than at a pressure which the first plasma process 131P is performed. For example, the second plasma process 133P may be performed at a pressure that is higher by approximately 1 torr. The second plasma process 133P may be performed in the atmosphere of oxygen. The second plasma process 133P may include a plasma oxidation.

Through the second plasma process 133P, the first interface layer 112U oxidize the surface of the bottom electrode 111 is formed in the upper bottom electrode 111U through a nitrogen reduction reaction/an oxygen substitution reaction 133A as shown in FIG. 5. The second interface layer 112L is formed in the lower bottom electrode 111L through an oxidation reaction. The first interface layer 112U and the second interface layer 112L may preferably have the same thickness (D11=D12).

By sequentially performing a series of processes, which includes the low-pressure first plasma process 131P and the high-pressure second plasma process 133P, the interface layer 112P having a uniform thickness can be formed on the surface of the bottom electrode 111P. The interface layer 112P may include the first interface layer 112U and the second interface layer 112L. The first interface layer 112U and the second interface layer 112L may include an oxide. The first interface layer 112U and the second interface layer 112L may be of an oxide that, includes the metal element of the bottom electrode 111P. In some embodiments, when the bottom electrode 111P is of a titanium nitride, the first interface layer 112U and the second interface layer 112L may include a titanium oxide (TiO$_2$). Alternatively, when the bottom electrode 111P includes a tantalum nitride (TaN), the first interface layer 112U and the second interface layer 112L may include a tantalum oxide (Ta$_2$O$_5$).

Figure 7D:
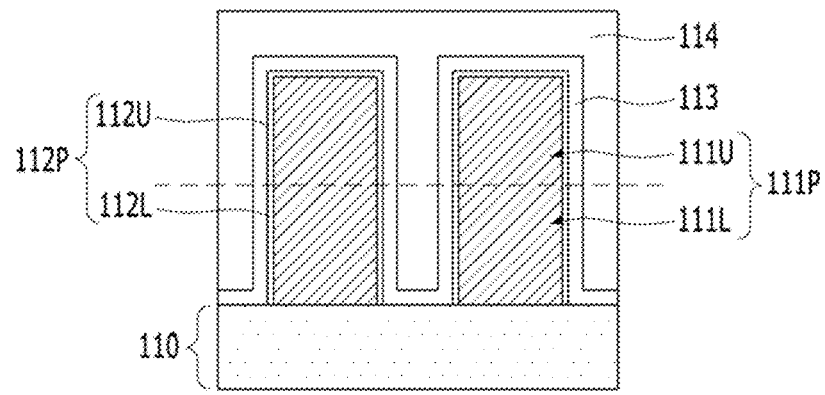

Referring to FIG. 7D, the dielectric layer 113 and the top electrode 114 may be formed over the interface layer 112P.

Figure 8A:
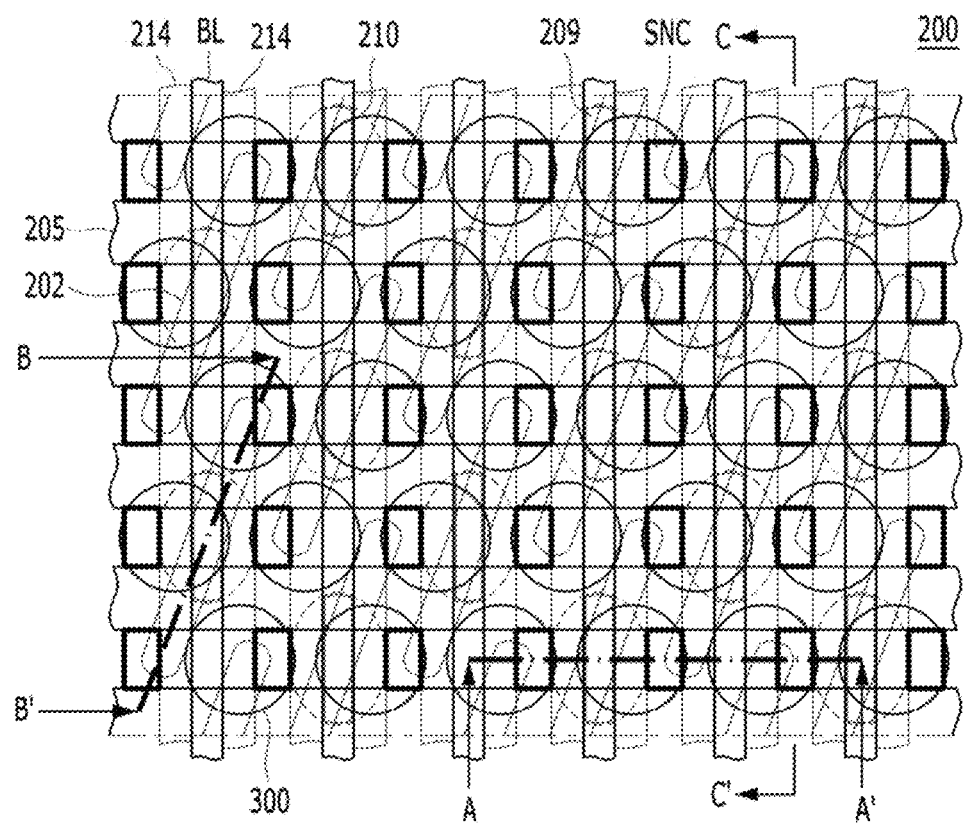
FIGS. 8A to 8C are diagrams illustrating a semiconductor device in accordance with an embodiment of the present invention.
Figure 8B:
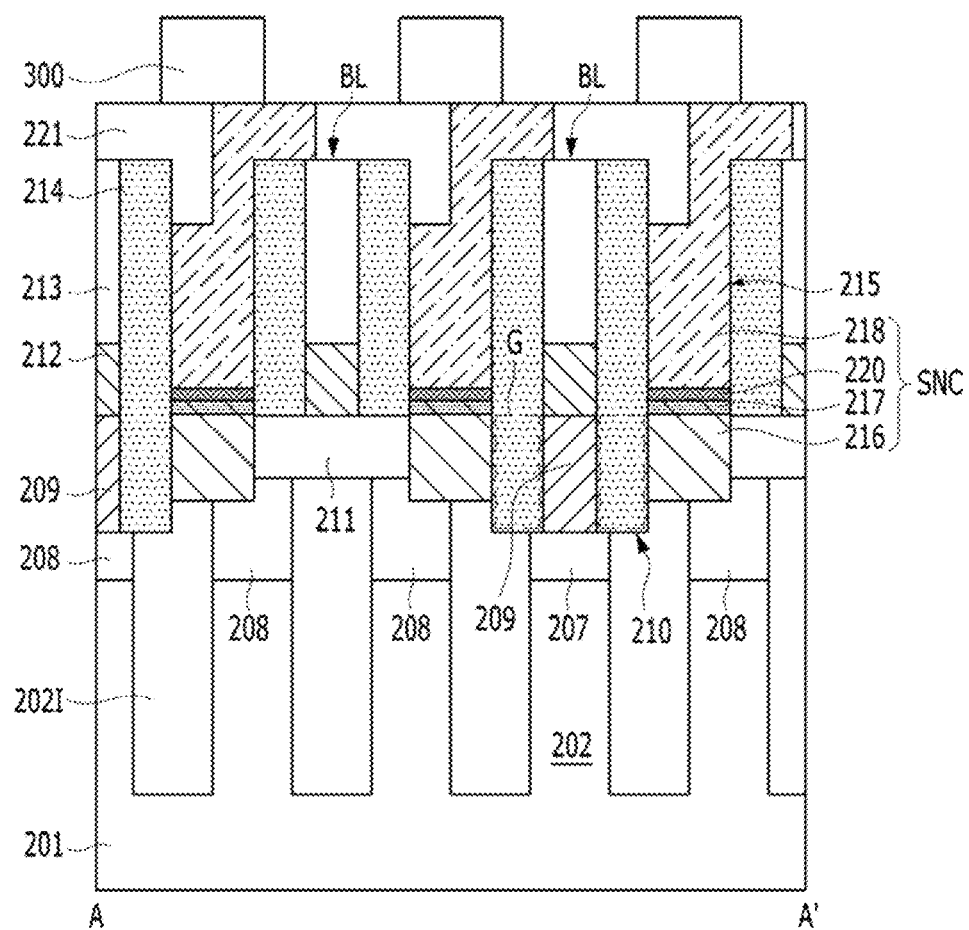
Figure 8C:
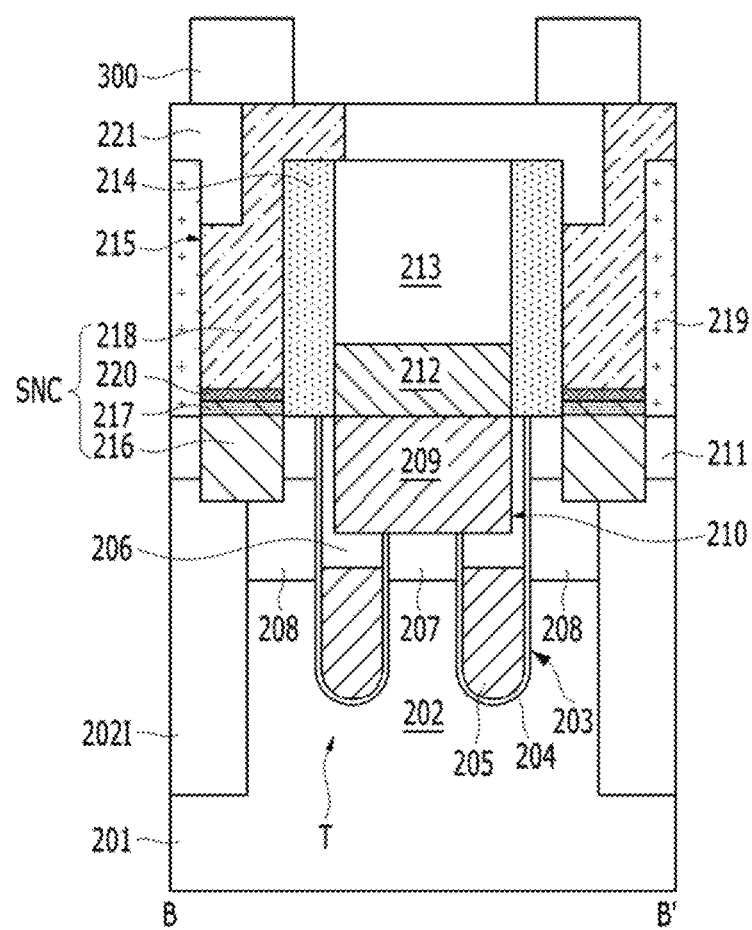

FIGS. 8A to 8C illustrate a semiconductor device 200 in accordance with an embodiment of the present invention. In an embodiment of the present invention, a semiconductor device having memory cells, such as a DRAM, is described. FIG. 8A is a plan view of the semiconductor device 200 in accordance with an embodiment of the present invention. FIG. 8B is a cross-sectional view of the semiconductor device 200 of FIG. 8A taken along a line A-A'. FIG. 8C is a cross-sectional view of the semiconductor device 200 of FIG. 8A taken along a line B-B'.

Referring to FIGS. 8A to 8C, the semiconductor device 200 may include a plurality of memory cells. Each memory cell may include a cell transistor T including a buried word line 205, a bit line 212, and a capacitor 300.

The semiconductor device 200 may be described below in detail.

An isolation layer 202I and an active region 202 may be formed in a substrate 201. A plurality of active regions 202 may be defined by the isolation layer 202I. The substrate 201 may be of a material that is appropriate for a semiconductor processing. The substrate 201 may include a semiconductor substrate. The substrate 201 may be formed of a silicon-containing material. The substrate 201 may include silicon, monocrystalline silicon, polycrystalline silicon, amorphous silicon, a silicon germanium, a monocrystalline silicon germanium, a polycrystalline silicon germanium, a carbon-doped silicon, a combination thereof, or a multi-layer including two or more of them. The substrate 201 may include another semiconductor material, such as germanium. The substrate 201 may include III/V-group semiconductor substrates, e.g., a compound semiconductor substrate, such as a III/V-group semiconductor substrate. The substrate 201 may include a Silicon-On-Insulator (SOI) substrate. The isolation layer 202I may be formed through a Shallow Trench Isolation (STI) process.

A gate trench 203 may be formed in the substrate 201. A gate insulation layer 204 may be formed on the surface of the gate trench 203. A buried word line 205 filling a portion of the gate trench 203 may be formed over the gate insulation layer 204. A sealing layer 206 may be formed over the buried word line 205. The sealing layer 206 may have a height that is the same as a top surface of the substrate 201. The buried word line 205 may be of a level that is lower than the surface of the substrate 201. The buried word line 205 may be formed of a low-resistance metal material. For example, the buried word line 205 may include a titanium nitride and tungsten that are stacked sequentially. In another example, the buried word line 205 may be formed of a titanium nitride only (TiN only).

A first source/drain region 207 and a second source/drain region 208 may be formed in the substrate 201. The first source/drain region 207 and the second source/drain region 208 may be spaced apart from each other by the gate trench 203. As a result, the buried word line 205, the first source/drain region 207, and the second source/drain region 208 may form the cell transistor T. The cell transistor T may be able to improve a short channel effect by the buried word line 205.

A bit line contact plug 209 may be formed over the substrate 201. The bit line contact plug 209 may be coupled to the first source/drain region 207. The bit line contact plug 209 may be positioned in the inside of a bit line contact hole 210. The bit line contact hole 210 may be formed in a hard mask layer 211. The hard mask layer 211 may be formed over the substrate 201. The bit line contact hole 210 may expose the first source/drain region 207. The lower surface of the bit line contact plug 209 may be lower than the upper surface of the substrate 201. The bit line contact plug 209 may be formed of polysilicon or a metal material. A portion of the bit line contact plug 209 may have a shorter line width than a diameter of the bit line contact hole 210. As a result, a gap G may be formed on both sides of the bit line contact plug 209. The gap G may be independently formed on both sides of the bit line contact plug 209. In the inside of the bit line contact hole 210, one bit line contact plug 209 and a pair of gaps G may be disposed. The pair of the gaps G may be separated by the bit line contact plug 209. A gap G may be disposed between the bit line contact plug 209 and a silicon plug 216.

A bit line structure BL may be formed over the bit line contact plug 209. The bit line structure BL may include the bit line 212 and a bit line capping layer 213 over the bit line 212. The bit line structure BL may have an elongated linear shape extending in a direction intersecting with the buried word line 205. A portion of the bit line 212 may be coupled to the bit line contact plug 209. From the perspective of an A-A' direction, the bit line 212 and the bit line contact plug 209 may be the same as a line width. Therefore, the bit line 212 may be extended in one direction while covering the bit line contact plug 209. The bit line 212 may include a metal material. The bit line capping layer 213 may include an insulating material.

A spacer element 214 may be formed on the sidewall of the bit line structure BL. The spacer element 214 may include a plurality of spacers. The bottom portion of the spacer element 214 may fill the gaps G on both sides of the bit line contact plug 209. The spacer element 214 may include a silicon oxide, a silicon nitride, or a combination thereof. The spacer element 214 may include a Nitride-Oxide-Nitride (NON) structure. Alternatively, the spacer element 214 may include an air gap. For example, the spacer element 214 may include a Nitride-Air gap-Nitride (NAN) structure.

A storage node contact structure (SNC) may be formed between neighboring bit line structures BL. The storage node contact structure (SNC) may be formed in a storage node contact hole 215. The storage node contact hole 215 may have a high aspect ratio. The storage node contact structure (SNC) may be coupled to the second source/drain region 208. The storage node contact structure (SNC) may include a silicon plug 216 and a metal plug 218. The upper portion of the metal plug 218 may be extended to partially overlap with the upper surface of the bit line structure BL. The metal plug 218 may be adjacent to the bit line 212. The silicon plug 216 may be adjacent to the bit line contact plug 209. From the perspective of a direction (C-C' direction of FIG. 8A) that is in parallel to the bit line structure BL, a plug isolation layer 219 may be formed between neighboring storage node contact structures (SNC). The plug isolation layer 219 may be formed between neighboring bit line structures BL and provide the storage node contact hole 215 with the hard mask layer 211.

The storage node contact structure (SNC) may further include an interface doping layer 217 and a metal silicide layer 220 between the silicon plug 216 and the metal plug 218.

The silicon plug 216 may include a polysilicon layer or an epitaxial silicon layer. The epitaxial silicon layer may be formed through a selective epitaxial growth (SEG). The epitaxial silicon layer may include SEG SiP.

The metal plug 218 may include tungsten. The metal silicide layer 220 may include a cobalt silicide.

The interface doping layer 217 may include a polysilicon layer doped with boron or an epitaxial silicon layer doped with boron.

A capping layer 221 may be formed between the metal plug 218 of the storage node contact structure (SNC) and the upper portion of the bit line structure BL.

The capacitor 300 may be formed over the storage node contact structure (SNC).

The capacitor 300 may include a capacitor 120 of a cylindrical shape shown in FIGS. 1A to 1E. Alternatively, the capacitor 300 may include a capacitor 120P of a pillar shape shown in FIG. 6.

FIGS. 9A to 9H are cross-sectional views illustrating a first example of a method for fabricating the semiconductor device in accordance with an embodiment of the present invention. Hereafter, for the sake of convenience its description, as for the method for forming a lower structure disposed in the lower portion of the capacitor 300 among the constituent elements of the semiconductor device 200 illustrated in FIGS. 8A to 8C, known methods may be referred to.

Figure 9A:
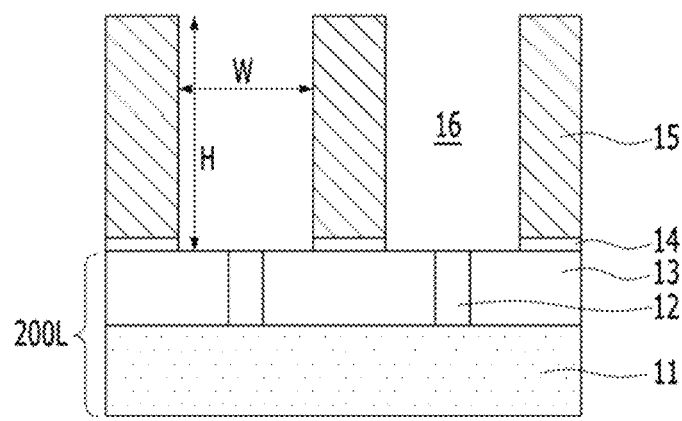
FIGS. 9A to 9H are cross-sectional views illustrating a first example of a method for fabricating the semiconductor device in accordance with an embodiment of the present invention.

Referring to FIG. 9A, a lower structure 200L may be formed. The lower structure 200L may include a substrate 11 and a storage node contact structure 12 that is formed over the substrate 11. The storage node contact structure 12 may penetrate through an inter-layer dielectric layer 13 to be coupled to the substrate 11. The storage node contact structure 12 may correspond to the storage node contact structure (SNC) of FIGS. 8A to 8C. Although not its illustrated, the lower structure 200L may further include a cell transistor, a bit line contact plug, and a bit line. As for the constituent elements of the lower structure 200L FIGS. 8A to 8C may be referred to.

Subsequently, an etch stop layer 14 may be formed over the lower structure 200L A mold layer 15 may be formed over the etch stop layer 14. The mold layer 15 may include a dielectric material. The mold layer 15 may be made, for example, of a silicon oxide. The mold layer 15 may be a single layer or a multi-layer including at least two or more layers. For example, the mold layer 15 may include a first mold layer and a second mold layer that are stacked one on another. The first and second mold layers may be formed of different silicon oxides.

The etch stop layer 14 may be formed of a material having an etch selectivity with respect to the mold layer 15. For example, the etch stop layer 14 may include a silicon nitride.

Subsequently, an opening 16 may be formed, for example, by etching the mold layer 15. An etch process for forming the opening 16 may stop at the etch stop layer 14. The opening 16 may be referred to as a hole where a bottom electrode (or a storage node) is to be formed. The opening 16 may have a high aspect ratio. The opening 16 may have an aspect ratio of at least approximately 1:1. For example, the opening 16 may have a high aspect ratio of approximately 1:10 or higher. An aspect ratio may refer to a ratio of its width W to height H thereof.

Subsequently, the upper surface of the storage node contact structure 12 below the opening 16 may be exposed by etching the etch stop layer 14.

Figure 9B:
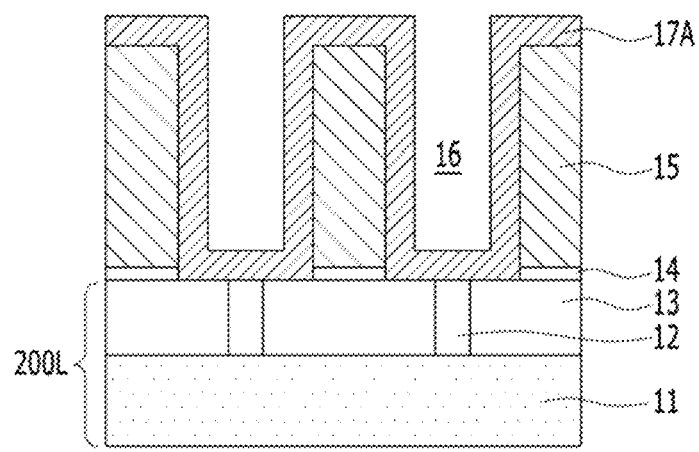

Referring to FIG. 9B a bottom electrode layer 17A may be formed in the inside of the opening 16. The bottom electrode layer 17A may be conformally formed over the profile of the opening 16.

To form the bottom electrode layer 17A in the opening 16, the bottom electrode layer 17A may be formed by using a film forming technology having excellent step coverage. For example, the bottom electrode layer 17A may be formed through a Chemical Vapor Deposition (CVD) process or an Atomic Layer Deposition (ALD) process. The bottom electrode layer 17A may include a metal, a metal nitride, or a combination thereof. The bottom electrode layer 17A may include at least one selected from a group including titanium (Ti), a titanium nitride (TiN), tantalum (Ta), a tantalum nitride (TaN), a titanium aluminum nitride (TiAlN), tungsten (W), a tungsten nitride (WN), ruthenium (Ru), a ruthenium oxide ($RuO_2$), iridium (Ir), an iridium oxide ($IrO_2$), platinum (Pt), and a combination thereof. In some embodiments, the bottom electrode layer 17A may include a titanium nitride (TiN). The bottom electrode layer 17A may include a titanium nitride that is formed through an Atomic Layer Deposition process (ALD-TiN). The bottom electrode layer 17A may be a titanium nitride having a stoichiometric composition ratio. The stoichiometric composition ratio may be a composition ratio of nitrogen to titanium, which may be approximately 1:1.

Figure 9C:
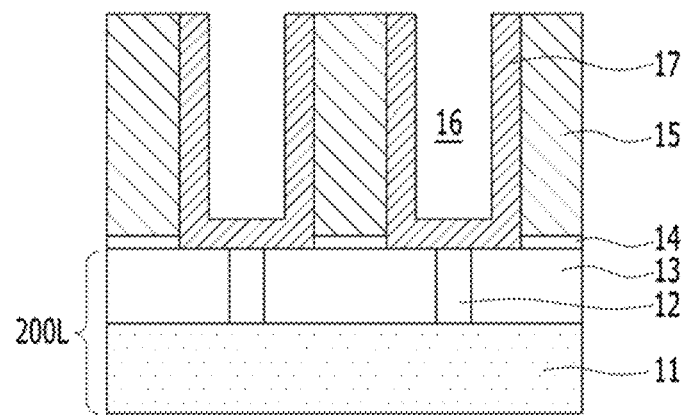

Referring to FIG. 9C, a bottom electrode 17 may be formed. The bottom electrode 17 may be disposed inside of the opening 16. The bottom electrode 17 may be formed by performing a selective etch process onto the bottom electrode layer 17A. The selective etch process may be a Chemical Mechanical Polishing (CMP) process or an etch-back process. For example, a protective layer (not shown) filling the opening 16 is formed over the bottom electrode layer 17A, and then the Chemical Mechanical Polishing (CMP) process may be performed until the surface of the mold layer 15 is exposed.

The bottom electrode 17 may have a cylindrical shape. The bottom electrode 17 may be electrically connected to the storage node contact structure 12.

Figure 9D:
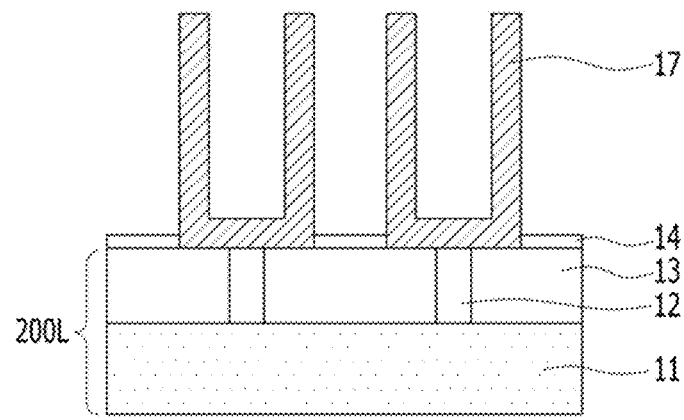

Referring to FIG. 9D, the mold layer 15 may be removed. For example, the mold layer 15 may be removed through a wet dip-out process. When the mold layer 15 is removed, the etch stop layer 14 may protect the lower structure 200L from being damaged.

As the mold layer 15 is removed, both internal walls and external walls of the bottom electrode 17 may be exposed. The surrounding area of the bottom of the bottom electrode 17 may be supported by the etch stop layer 14.

The bottom electrode 17 may have a high aspect ratio. The bottom electrode 17 may have the same aspect ratio as the opening 16. For example, the bottom electrode 17 may have a high aspect ratio of approximately 1:10 or higher.

Figure 9E:
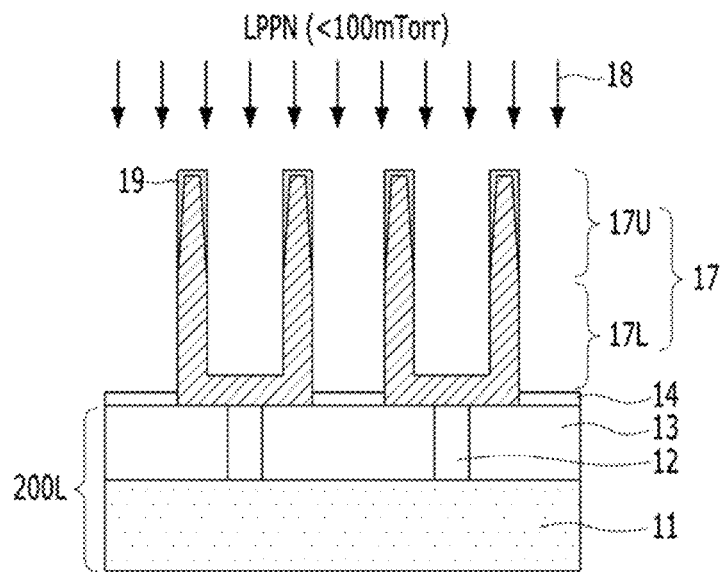

Referring to FIG. 9E, a nitrogen-rich layer 19 may be formed through a first plasma process 18. The first plasma process 18 may correspond to the first plasma process 131 of FIG. 2A. The first plasma process 18 may be performed at a low pressure. Since the first plasma process 18 is performed at a low pressure, a great deal of ion plasma may be formed. Herein, an additive gas may be added in order to increase the efficiency of the ion plasma. The additive gas may include argon (Ar) or helium (He).

The first plasma process 18 may include a low-pressure plasma nitridation (LPPN). The first plasma process 18 may be performed in the atmosphere of a nitrogen-containing gas at a low pressure. For example, the first plasma process 18 may be performed using a nitrogen gas ($N_2$) or an ammonia $NH_3$) gas at a pressure of approximately 100 mTorr or lower.

In some embodiments, when the first plasma process 18 is performed in the atmosphere of nitrogen at a low pressure, the highly reactive nitrogen ion plasma may be bombarded into the upper portion of the bottom electrode 17. As a result of the first plasma process 18, the nitrogen-rich layer 19 may be formed. For example, when the bottom electrode 17 is formed of a titanium nitride, the nitrogen-rich layer 19 may include a nitrogen-rich titanium nitride (N-rich $Ti_xN_y$). The upper portion of the bottom electrode 17 may not be completely transformed into the nitrogen-rich layer 19. The bottom electrode 17 may include a lower bottom electrode 17L and an upper bottom electrode 17U. The nitrogen-rich layer 19 may be formed on the surface of the upper bottom electrode 17U. The lower bottom electrode 17L is not affected by the plasma process. In short, the lower bottom electrode 17L may not include the nitrogen-rich layer 19.

The nitrogen-rich layer 19 is locally formed in the upper bottom electrode 17U through the first plasma process 18. Due to the nitrogen-rich layer 19, the bottom electrode 17 may have an ununiform nitrogen profile. The lower bottom electrode 17L may remain as a titanium nitride, and the upper bottom electrode 17U may include a titanium nitride and a nitrogen-rich titanium nitride that are mixed together. Therefore, the upper bottom electrode 17U and the lower bottom electrode 17L may be formed of a titanium nitride of different nitrogen contents. In addition the lower bottom electrode 17L may be formed of a titanium nitride having a stoichiometric composition ratio, and the upper bottom electrode 17U may be formed of a nitrogen-rich titanium nitride.

The upper bottom electrode 17U and the lower bottom electrode 17L may have the same height or different heights.

Figure 9F:
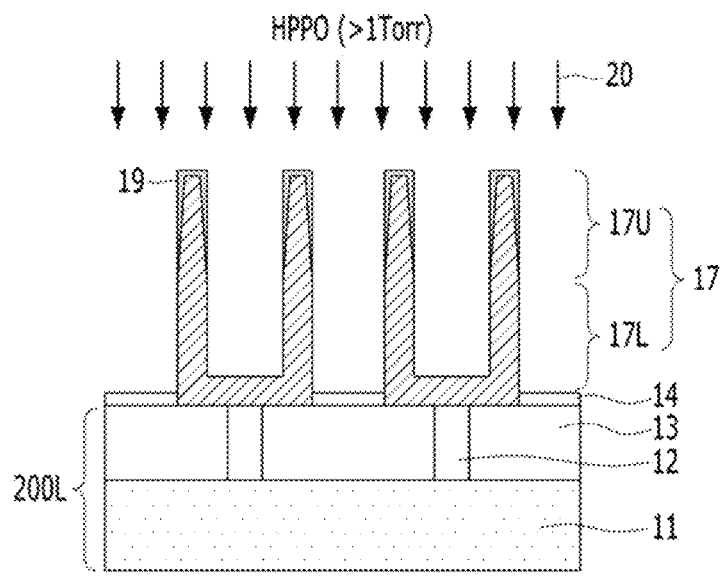

Referring to FIG. 9F, after the first plasma process 18, a second plasma process 20 may be performed following the first plasma process 18. The second plasma process 20 may correspond to the second plasma process 133 of FIG. 2C. The second plasma process 20 may be performed at a higher pressure than at a pressure which the first plasma process 18 is performed. For example, the second plasma process 20 may be performed at a pressure that is higher by approximately 1 torr. The second plasma process 20 may be performed at an atmosphere of oxygen. The second plasma process 20 may include a high pressure plasma oxidation (HPPO).

Figure 9G:
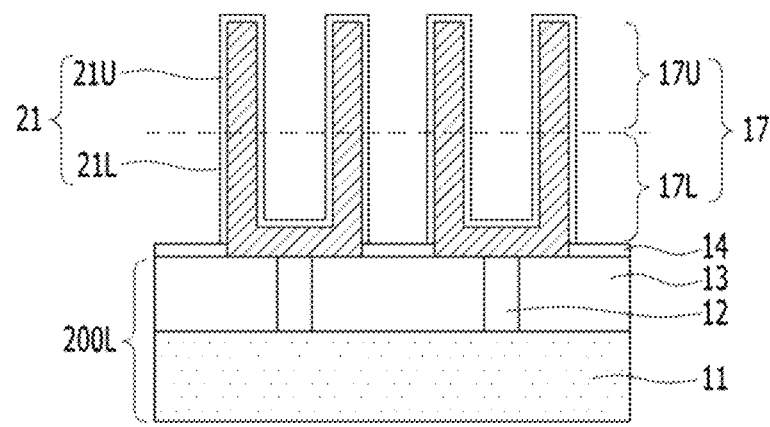

Through the second plasma process 20, as illustrated in FIG. 9G, a first interface layer 21U is formed in the upper bottom electrode 17U through a nitrogen reduction reaction/ an oxygen substitution reaction. A second interface layer 21L is formed in the lower bottom electrode 17L through an oxidation reaction. The first interface layer 21U and the second interface layer 21L may preferably have the same thickness.

An interface layer 21 having a uniform thickness can be formed on the surface of the bottom electrode 17 by sequentially performing a series of the processes, which include the low-pressure first plasma process 18 and the high-pressure second plasma process 20. The interface layer 21 may include an oxide obtained by oxidizing the surface of the bottom electrode 17. When the bottom electrode 17 includes a metal nitride, the interface layer 21 may be a metal oxide. When the bottom electrode 17 includes a titanium nitride, the interface layer 21 may be a titanium oxide ($TiO_2$).

Figure 9H:
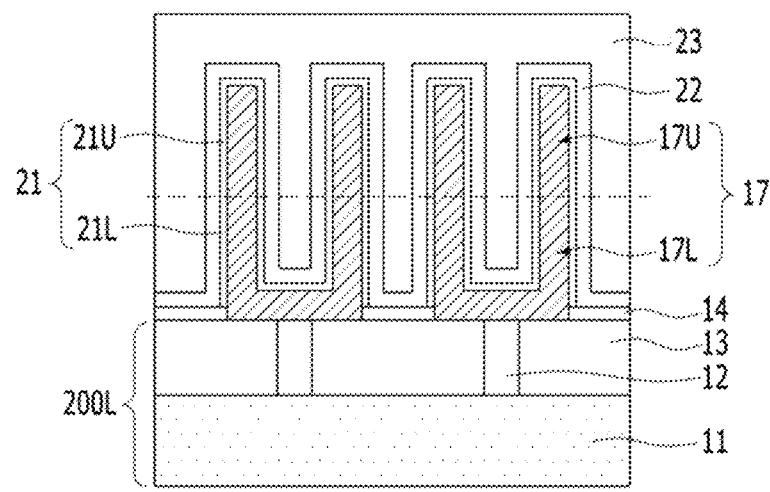

Referring to FIG. 9H, a dielectric layer 22 may be formed. The dielectric layer 22 may be formed over the interface layer 21. The dielectric layer 22 may be made of a high-k material whose dielectric rate is higher than a silicon oxide. The high-k material may include a hafnium oxide ($HfO_2$), a zirconium oxide ($ZrO_2$), an aluminum oxide ($Al_2O_3$), a titanium oxide ($TiO_2$), a tantalum oxide ($Ta_2O_5$), a niobium oxide ($Nb_2O_5$), or a strontium titanium oxide ($SrTiO_3$). Alternatively, the dielectric layer 22 may be formed of a composite layer that includes two or more layers of the aforementioned high-k materials.

In some embodiments, the dielectric layer 22 may be formed of a zirconium oxide-based material having excellent leakage current characteristics while sufficiently decreasing an equivalent-oxide thickness (EOT). For example, the dielectric layer 22 may include ZAZ ($ZrO_2$/$Al_2O_3$/$ZrO_2$). Alternatively, the dielectric layer 22 may include HAH ($HfO_2$/$Al_2O_3$/$HfO_2$). When the interface layer 112 includes a titanium oxide ($TiO_2$) and the dielectric layer 22 includes ZAZ ($ZrO_2$/$Al_2O_3$/$ZrO_2$), a dielectric layer stack formed of TZAZ ($TiO_2$/$ZrO_2$/$Al_2O_3$/$ZrO_2$) may be formed over the bottom electrode 17. Diverse dielectric layer stacks may be described by referring to FIGS. 1B to 1E.

The dielectric layer 22 may be formed through a Chemical Vapor Deposition (CVD) process or an Atomic Layer Deposition (ALD) process having excellent step coverage.

After the dielectric layer 22 is formed, a top electrode 23 its may be formed over the dielectric layer 22. The top electrode 23 may include a material which is the same as that of the bottom electrode 17. The top electrode 23 may be made of a metal-based material. For example, the top electrode 23 may include titanium (Ti), a titanium nitride (TiN), tantalum (Ta), a tantalum nitride (TaN), a titanium aluminum nitride (TiAlN), tungsten (W), a tungsten nitride (WN), ruthenium (Ru), a ruthenium oxide ($RuO_2$), iridium (Ir) an iridium oxide ($IrO_2$), platinum (Pt), or a combination thereof. The top electrode 23 may be formed through a low-pressure Chemical Vapor Deposition (LPCVD) process, a Plasma Enhanced Chemical Vapor Deposition (PECVD) process, or an Atomic Layer Deposition (ALD) process. Alternatively, the top electrode 23 may include a titanium nitride that is formed through an Atomic Layer Deposition process (ALD-TiN).

In some embodiments, the top electrode 23 may have a multi-layer structure. The top electrode 23 may be formed by sequentially stacking a first metal-containing layer, a silicon germanium layer, and a second metal-containing layer. The first metal-containing layer and the second metal-containing layer may include titanium (Ti), a titanium nitride (TiN), tantalum (Ta), a tantalum nitride (TaN), a titanium aluminum nitride (TiAlN) tungsten (W), a tungsten nitride (WN), ruthenium (Ru), a ruthenium oxide ($RuO_2$), iridium (Ir), an iridium oxide ($IrO_2$), platinum (Pt) or a combination thereof. For example, the first metal-containing layer may be a titanium nitride (TiN), and the second metal-containing layer may be WN/W where a tungsten nitride (WN) and tungsten (W) are stacked. The silicon germanium layer may be doped with a suitable dopant, such as, for example, boron.

The top electrode 23 may be formed by depositing an upper top electrode (not shown) and performing a top electrode patterning process.

FIGS. 10A to 10F are simplified cross-sectional views illustrating a second example of a method for fabricating the semiconductor device in accordance with an embodiment of the present invention. Hereafter, for the sake of convenience in description, as for the method for forming a lower structure disposed in the lower portion of the capacitor 300 among the constituent elements of the semiconductor device 200 illustrated in FIGS. 8A to 8C, known methods may be referred to.

First, as illustrated in FIG. 9A, the opening 16 may be formed over the lower structure 200L.

Figure 10A:
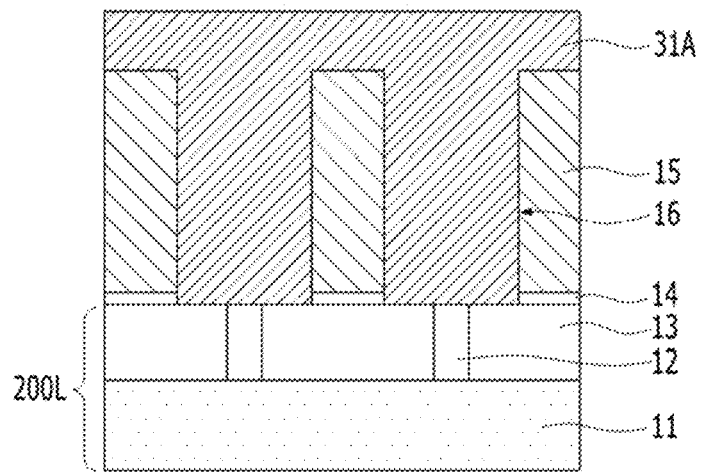
FIGS. 10A to 10F are cross-sectional views illustrating a second example of a method for fabricating the semiconductor device in accordance with an embodiment of the present invention.

Subsequently, referring to FIG. 10A, a bottom electrode layer 31A may be formed in the inside of the opening 16. The bottom electrode layer 31A may be formed over the mold layer 15 and fill the inside of the opening 16. The bottom electrode layer 31A may be made of a metal, a metal nitride, or a combination thereof. For example, the bottom electrode layer 31A may include at least one selected from a group including titanium (Ti), a titanium nitride (TiN), tantalum (Ta), a tantalum nitride (TaN), a titanium aluminum nitride (TiAlN), tungsten (W), a tungsten nitride (WN), ruthenium (Ru), a ruthenium oxide ($RuO_2$), iridium (Ir), an iridium oxide ($IrO_2$), platinum (Pt), and a combination thereof. In some embodiments, the bottom electrode layer 31A may include a titanium nitride (TiN). Alternatively, the bottom electrode layer 31A may include a titanium nitride that is formed through an Atomic Layer Deposition process (ALD) (ALD-TiN). The bottom electrode layer 31A may be a titanium nitride having a stoichiometric composition ratio. The stoichiometric composition ratio may be a composition ratio of nitrogen to titanium, which may be approximately 1:1.

Figure 10B:
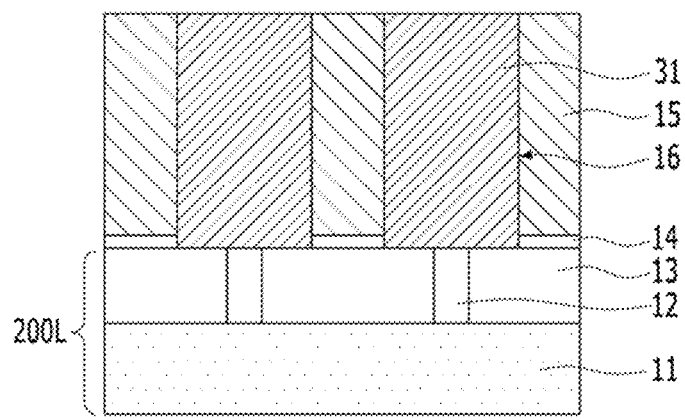

Referring to FIG. 10B, a bottom electrode 31 may be formed. The bottom electrode 31 may be disposed inside of the opening 16. The bottom electrode 31 may be formed by performing a selective etch process onto the bottom electrode layer 31A. The selective etch process may be a Chemical Mechanical Polishing (CMP) process or an etch-back process. For example, a Chemical Mechanical Polishing (CMP) process may be performed onto the bottom electrode layer 31A until the surface of the mold layer 15 is exposed.

The bottom electrode 31 may have a pillar shape filling the opening 16. The bottom electrode 31 may be electrically connected to the storage node contact structure 12.

Figure 10C:
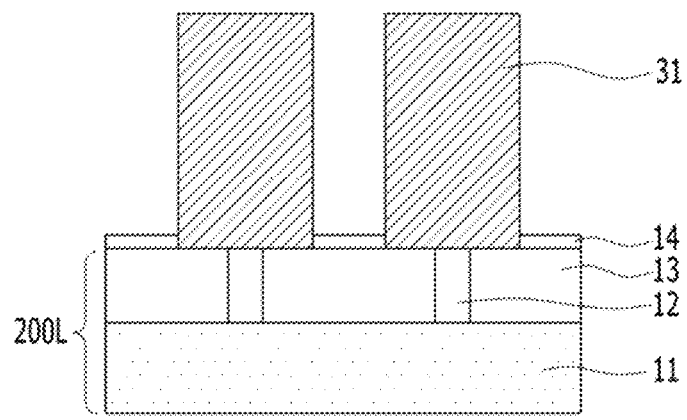

Referring to FIG. 10C, the mold layer 15 may be removed. For example, the mold layer 15 may be removed through a wet dip-out process. When the mold layer 15 is removed, the etch stop layer 14 may protect the lower structure 200L from being damaged.

As the mold layer 15 is removed, external walls of the bottom electrode 31 may be exposed. The surrounding area of the bottom of the bottom electrode 31 may be supported by the etch stop layer 14.

The bottom electrode 31 may have a high aspect ratio. The bottom electrode 31 may have the same aspect ratio as the opening 16. For example, the bottom electrode 31 may have a high aspect ratio of approximately 1:10 or higher.

Figure 10D:
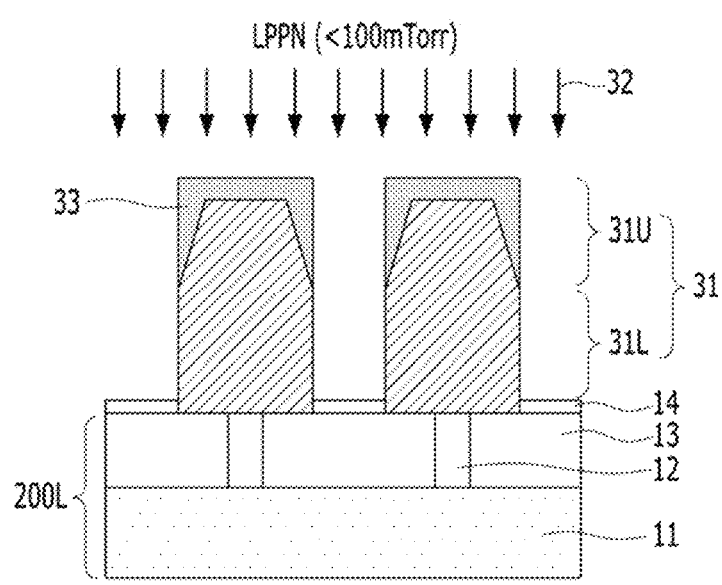

Referring to FIG. 10D, a first plasma process 32 may be performed. The first plasma process 32 may correspond to the first plasma process 131 and 131P of FIGS. 2A and 5, respectively. The first plasma process 32 may be performed at a low pressure. The first plasma process 32 may include a low-pressure plasma nitridation (LPPN). The first plasma process 32 may be performed in the atmosphere of a nitrogen-containing gas at a low pressure. For example, the first plasma process 32 may be performed using a nitrogen gas ($N_2$) or an ammonia ($NH_3$) gas at a pressure of approximately 100 mTorr or lower.

As a result of the first plasma process 32, a nitrogen-rich layer 33 may be formed. For example, when the bottom electrode 31 is formed of a titanium nitride, the nitrogen-rich layer 33 may include a nitrogen-rich titanium nitride (N-rich $Ti_xN_y$). The bottom electrode 31 may include a lower bottom electrode 31L and an upper bottom electrode 31U. The upper bottom electrode 31U may not be completely transformed into the nitrogen-rich layer 33. The nitrogen-rich layer 33 can be formed on the surface of the upper bottom electrode 31U. The lower bottom electrode 31L is not affected by the plasma process. In short, the lower bottom electrode 31L may not include the nitrogen-rich layer 33.

As described above, the nitrogen-rich layer 33 is locally formed in the upper bottom electrode 31U through the first plasma process 32. Due to the nitrogen-rich layer 33, the bottom electrode 31 may have an ununiform nitrogen profile. The lower bottom electrode 31l, may remain as a titanium nitride, and the upper bottom electrode 31U may include a titanium nitride and a nitrogen-rich titanium nitride that are mixed together. Therefore, the upper bottom electrode 31U and the lower bottom electrode 31L may be formed of a titanium nitride of different nitrogen contents. In addition, the lower bottom electrode 31L may be formed of a titanium nitride having a stoichiometric composition ratio, and the upper bottom electrode 31U may be formed of a nitrogen-rich titanium nitride.

Figure 10E:
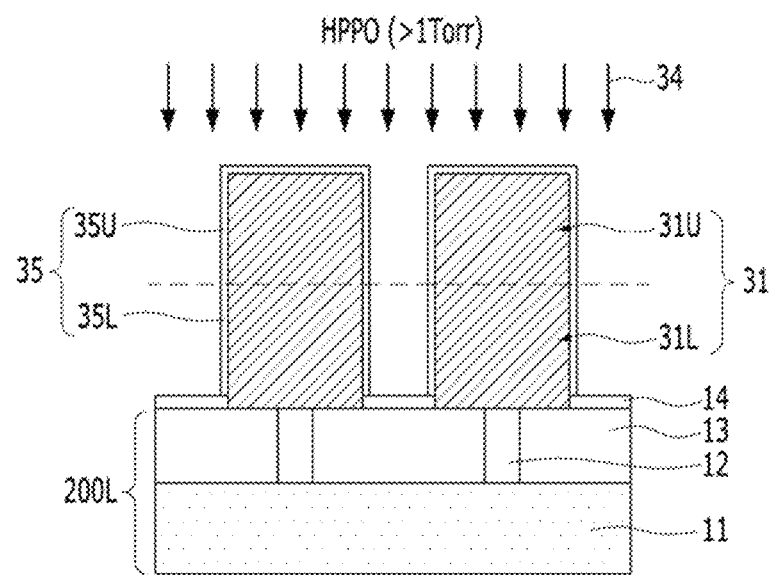

Referring to FIG. 10E, an interface layer 35 may be formed through a second plasma process 34. The second plasma process 34 may correspond to the second plasma processes 133 and 133P of FIGS. 2C and 5, respectively. The second plasma process 34 may be performed at a higher pressure than the first plasma process 32. For example, the second plasma process 34 may be performed at a pressure of 1 torr or higher. The second plasma process 34 may be performed in the atmosphere of oxygen. The second plasma process 34 may include a high-pressure plasma oxidation (HIPPO).

A first interface layer 35U is formed in the upper bottom electrode 31U through a nitrogen reduction reaction/an oxygen substitution reaction. A second interface layer 35L is formed in the lower bottom electrode 31L through an oxidation reaction. The first interface layer 35U and the second interface layer 35L may preferably have the same thickness. The first interface layer 35U and the second interface layer 35L may be layers in continuum. The first interface layer 35U and the second interface layer 35L may be formed over the upper surface and external walls of the bottom electrode 31.

An interface layer 35 having a uniform thickness can be formed on the surface of the bottom electrode 31 by sequentially performing a series of the processes, which include the low-pressure first plasma process 32 and the high-pressure second plasma process 34. The interface layer 35 may include an oxide obtained by oxidizing the surface of the bottom electrode 31. When the bottom electrode 31 includes a metal nitride, the interface layer 35 may be a metal oxide. When the bottom electrode 31 includes a titanium nitride, the interface layer 35 may be a titanium oxide ($TiO_2$).

Figure 10F:
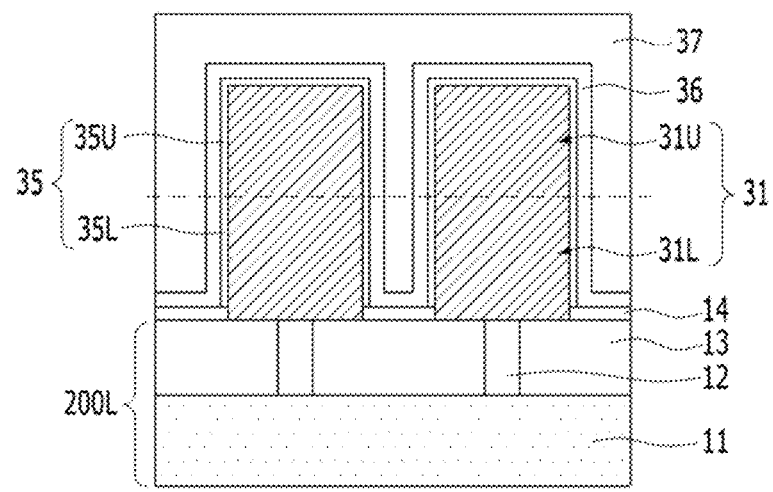

Referring to FIG. 10F, a dielectric layer 36 may be formed. The dielectric layer 36 may be formed over the interface layer 35. The dielectric layer 36 may be made of a high-k material whose dielectric rate is higher than a silicon oxide. The dielectric layer 36 may include ZAZ ($ZrO_2/Al_2O_3/ZrO_2$). Alternatively, the dielectric layer 36 may include HAH ($HfO_2/Al_2O_3/HfO_2$). When the interface layer 35 includes a titanium oxide ($TiO_2$) and the dielectric layer 36 includes ZAZ ($ZrO_2/Al_2O_3/ZrO_2$), a dielectric layer stack formed of TZAZ ($TiO_2/ZrO_2/Al_2O_3/ZrO_2$) may be formed over the bottom electrode 31.

After the dielectric layer 36 is formed, a top electrode 37 may be formed over the dielectric layer 36. The top electrode 37 may include a material which is the same as that of the bottom electrode 31. The top electrode 37 may be made of a metal-based material. In some embodiments, the top electrode 37 may include a titanium nitride (ALD-TiN) that is formed through an Atomic Layer Deposition process. Alternatively, the top electrode 37 may have a multi-layer structure. The top electrode 37 may be formed by sequentially stacking a first metal-containing layer, a silicon germanium layer, and a second metal-containing layer. For example, the first metal-containing layer may be a tantalum nitride (TaN), and the second metal-containing layer may be WN/W where a tungsten nitride (WN) and tungsten (W) are stacked. The silicon germanium its layer may be doped with a suitable dopant, such as, for example, boron.

FIGS. 11A to 11G illustrate a third example of a method for fabricating the semiconductor device in accordance with an embodiment of the present invention. For the sake of convenience in description, as for a method for forming a lower structure 200L disposed in the lower portion of a capacitor 300 among the constituent elements of the semiconductor device 200 shown in FIGS. 8A to 8C, known methods may be referred to.

Figure 11A:
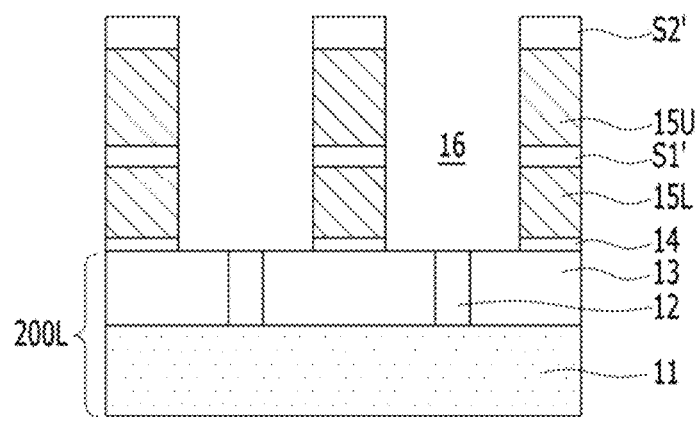
FIGS. 11A to 11G are cross-sectional views illustrating a third example of a method for fabricating the semiconductor device in accordance with an embodiment of the present invention.

Referring to FIG. 11A, the lower structure 200L may be formed. The lower structure 200L may include a substrate 11 and a storage node contact structure 12 that is formed over the substrate 11. The storage node contact structure 12 may penetrate through an inter-layer dielectric layer 13 to be coupled to the substrate 11. The storage node contact structure 12 may correspond to the storage node contact structure (SNC) of FIGS. 8A to 8C. Although not illustrated, the lower structure 200L may further include a cell transistor, a bit line contact plug, and a bit line. As for the constituent elements of the lower structure 200L, FIGS. 8A to 8C may be referred to.

Subsequently, an etch stop layer 14 may be formed over the lower structure 200L. A first mold layer 15L, a first supporter layer S1', a second mold layer 15U, and a second supporter layer S2' may be stacked over the etch stop layer 14. The first mold layer 15L and the second mold layer 15U may include a dielectric material. The first mold layer 15L and the second mold layer 15U may include a silicon oxide. The first mold layer 15L and the second mold layer 15U may be formed of different silicon oxides. The first supporter layer S1' and the second supporter layer S2' may be formed of a material having etch selectivity with respect to the first mold layer 15L and the second mold layer 15U. The first supporter layer S1' and the second supporter layer S2' may include a silicon nitride, a silicon carbo nitride (SiCN), or a combination thereof.

The etch stop layer 14 may be formed of a material having an etch selectivity with respect to the first mold layer 15L and the second mold layer 15U. The etch stop layer 14 may include a silicon nitride.

Subsequently, an opening 16 may be formed. The opening 16 may be formed by etching the second supporter layer S2', the second mold layer 15U, the first supporter layer S1', and the first mold layer 15L. An etch process for forming the opening 16 may stop at the etch stop layer 14. The opening 16 may be referred to as a hole where a bottom electrode (or a storage node) is to be formed. The opening 16 may have a high aspect ratio. The opening 16 may have an aspect ratio of at least approximately 1:1. For example, the opening 16 may have a high aspect ratio of approximately 1:10 or higher.

Subsequently, the upper surface of the storage node contact structure 12 below the opening 16 may be exposed by etching the etch stop layer 14.

Figure 11B:
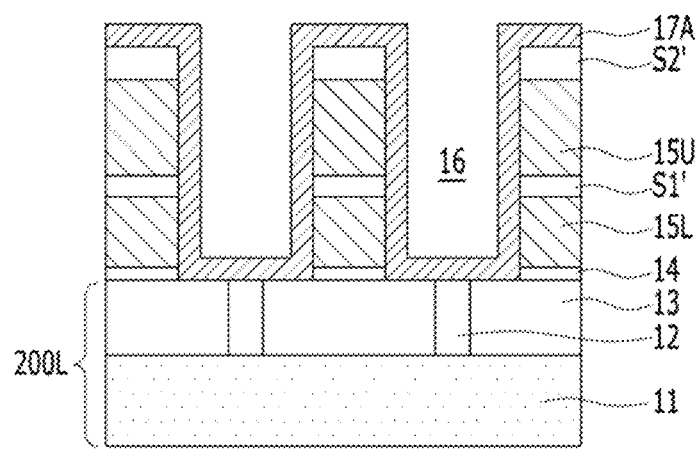

Referring to FIG. 11B, a bottom electrode layer 17A may be formed in the inside of the opening 16. The bottom electrode layer 17A may be conformally formed over the profile of the opening 16.

To form the bottom electrode layer 17A in the opening 16, the bottom electrode layer 17A may be formed by using a film forming technology having excellent step coverage. For example, the bottom electrode layer 17A may be formed through a Chemical Vapor Deposition (CVD) process or an Atomic Layer Deposition (ALD) process. The bottom electrode layer 17A may include a metal, a metal nitride, or a combination thereof. The bottom electrode layer 17A may include at least one selected from a group including titanium (Ti), a titanium nitride (TiN) tantalum (Ta), a tantalum nitride (TaN), a titanium aluminum nitride (TiAlN) tungsten (W), a tungsten nitride (WN), ruthenium (Ru), a ruthenium oxide ($RuO_2$), iridium (Ir) an iridium oxide ($IrO_2$), platinum (Pt), and a combination thereof. In some embodiments, the bottom electrode layer 17A may include a titanium nitride (TiN). The bottom electrode layer 17A may include a titanium nitride that is formed through an Atomic Layer Deposition process (ALD-TiN). The bottom electrode layer 17A may be a titanium nitride having a stoichiometric composition ratio. The stoichiometric composition ratio may be a composition ratio of nitrogen to titanium, which may be approximately 1:1.

Figure 11C:
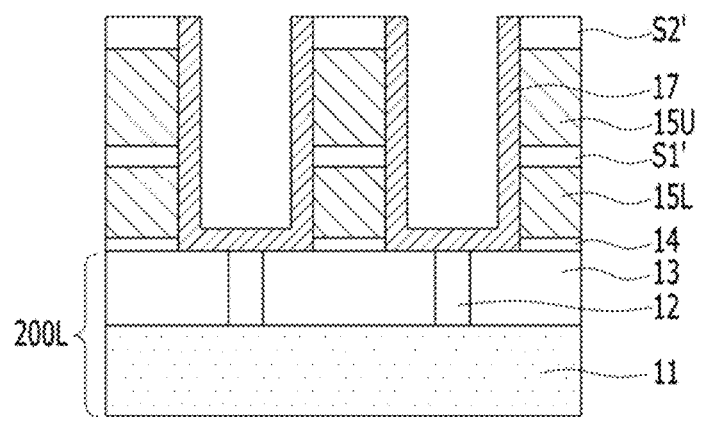

Referring to FIG. 11C, a bottom electrode 17 may be formed. The bottom electrode 17 may be disposed inside of the opening 16. The bottom electrode 17 may be formed by performing a selective etch process onto the bottom electrode layer 17A. The selective etch process may be a Chemical Mechanical Polishing (CMP) process or an etch-back process. For example, a protective layer (not shown) filling the opening 16 is formed over the bottom electrode layer 17A, and then the Chemical Mechanical Polishing (CMP) process may be performed until the surface of the second supporter layer S2' is exposed.

The bottom electrode 17 may have a cylindrical shape disposed along the bottom and sidewalls of the opening 16. The bottom electrode 17 may be electrically connected to the storage node contact structure 12.

Figure 11D:
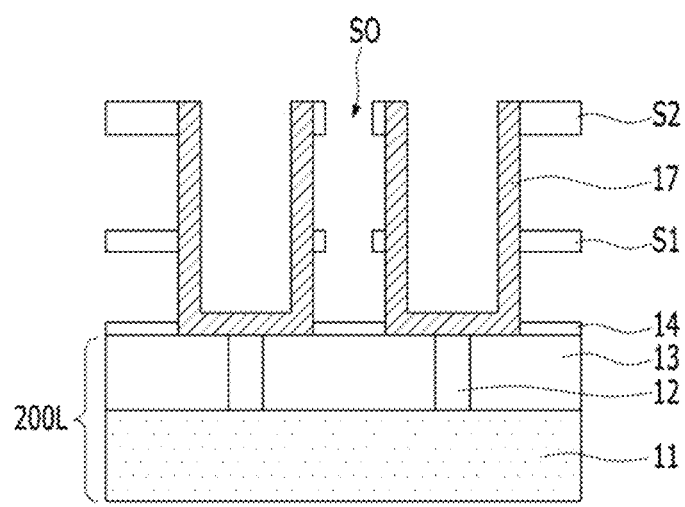

Referring to FIG. 11D, a second supporter S2 and a first supporter S1 may be formed. The second supporter S2 and the first supporter S1 may be formed by selectively etching the second supporter layer S2' and the first supporter layer S1'. For example, a supporter opening S0 and the second supporter S2 may be formed by etching the second supporter layer S2', and the second mold layer 15U may be removed through the supporter opening S0. Subsequently, after the first supporter S1 is formed by etching the first supporter layer S1', the first mold layer 15L may be removed. The second mold layer 15U and the first mold layer 15L may be removed through a wet dip-out process. The second supporter S2 may be formed on one sidewall of the bottom electrode 17 to contact one sidewall of another neighboring bottom electrode 17. Therefore, the second supporter S2 may be able to support the upper portions of a plurality of bottom electrodes 17. The first supporter S1 may be formed on one sidewall of the bottom electrode 17 to contact one sidewall of another neighboring bottom electrode 17. Therefore, the first supporter S1 may be able to support the lower portions of the bottom electrodes 17. The etch stop layer 14 may be exposed, as the first mold layer 15L and the second mold layer 15U are removed.

Since the first mold layer 15L and the second mold layer 15U are removed, both internal walls and external walls of the bottom electrode 17 may be exposed. The surrounding area of the bottom of the bottom electrode 17 may be supported by the etch stop layer 14.

The bottom electrode 17 may have a high aspect ratio. The bottom electrode 17 may have the same aspect ratio as the opening 16. For example, the bottom electrode 17 may have a high aspect ratio of approximately 1:10 or higher.

The first supporter S1 and the second supporter S2 may increase the structural stability of the bottom electrode 17.

Figure 11E:
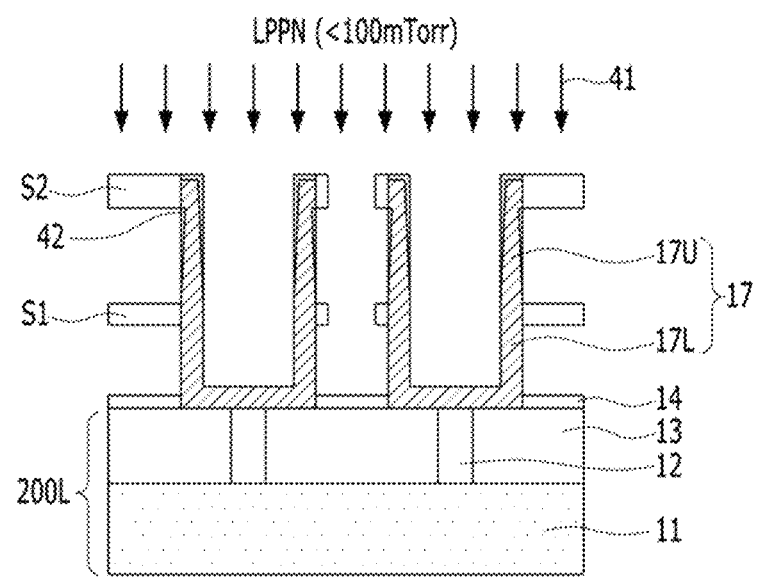

Referring to FIG. 11E, a nitrogen-rich layer 42 may be formed through a first plasma process 41. The first plasma process 41 may correspond to the first plasma process 131 of FIG. 2A. The first plasma process 41 may be performed at a low pressure. Since the first plasma process 41 is performed at a low pressure, a great deal of ion plasma may be formed. Herein, an additive gas may be added in order to increase the efficiency of the ion plasma. The additive gas may include argon (Ar) or helium (He).

The first plasma process 41 may include a low-pressure plasma nitridation (LPPN). The first plasma process 41 may be performed in the atmosphere of a nitrogen-containing gas at a low pressure. For example, the first plasma process 41 may be performed using a nitrogen gas ($N_2$) or an ammonia ($NH_3$) gas at a pressure of approximately 100 mTorr or lower.

In some embodiments, when the first plasma process 41 is performed in the atmosphere of nitrogen at a low pressure, the highly reactive nitrogen ion plasma may be bombarded into the upper portion of the bottom electrode 17. As a result of the first plasma process 41, the nitrogen-rich layer 42 may be formed. For example, when the bottom electrode 17 is formed of a titanium nitride, the nitrogen-rich layer 42 may include a nitrogen-rich titanium nitride (N-rich $Ti_xN_y$). The bottom electrode 17 may include a lower bottom electrode 17L and an upper bottom electrode 17U. The upper bottom electrode 17U may not be completely transformed into the nitrogen-rich layer 42. The nitrogen-rich layer 42 can be formed on the surface of the upper bottom electrode 17U. The lower bottom electrode 17L is not affected by the plasma process. In short, the lower bottom electrode 17L may not include the nitrogen-rich layer 42.

The nitrogen-rich layer 42 is locally formed in the upper bottom electrode 17U through the first plasma process 41. Due to the nitrogen-rich layer 42, the bottom electrode 17 may have an ununiform nitrogen profile. The lower bottom electrode 17L may remain as a titanium nitride, and the upper bottom electrode 17U may include a titanium nitride and a nitrogen-rich titanium nitride that are mixed together. Therefore, the upper bottom electrode 17U and the lower bottom electrode 17L may be formed of a titanium nitride of different nitrogen contents. In addition, the upper bottom electrode 17U may be formed of a nitrogen-rich titanium nitride, and the lower bottom electrode 17L may be formed of a titanium nitride having a stoichiometric composition ratio.

In some embodiments, the nitrogen-rich layer 42 may be formed in a portion of the upper bottom electrode 17U that does not contact the second supporter S2. Alternatively, the nitrogen-rich layer 42 may be formed in a portion contacting the second supporter S2 and a portion not contacting the second supporter S2.

Although not illustrated, the second supporter S2 may be exposed to the first plasma process 41 to be nitridized.

Figure 11F:
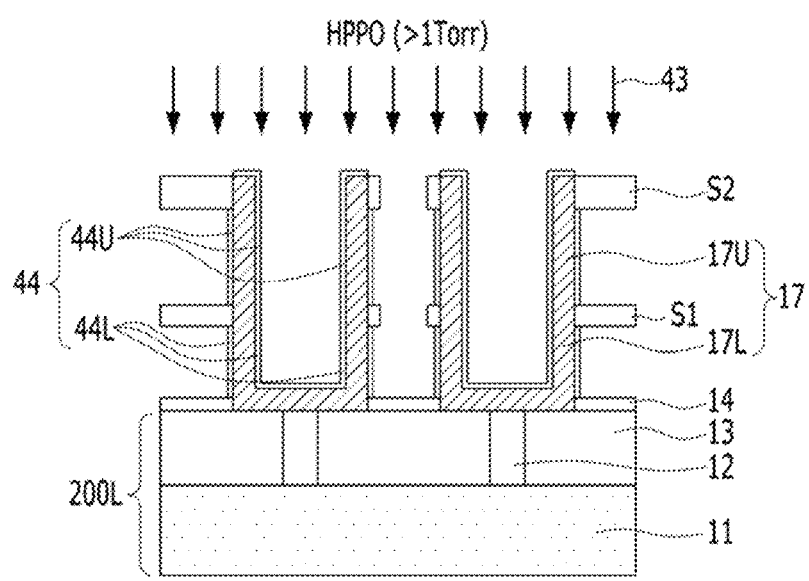
Figure 11G:
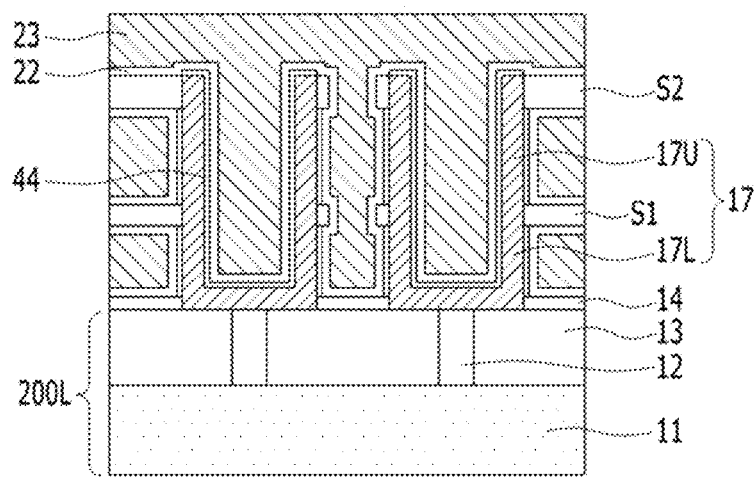

Referring to FIG. 11F, an interface layer 44 may be formed by performing a second plasma process 43. The second plasma process 43 may correspond to the second plasma process 133 of FIG. 2C. The second plasma process 43 may be performed at a higher pressure than the pressure at which the first plasma process 41 is performed. For example, the second plasma process 43 may be performed at a pressure that is higher by approximately 1 torr. The second plasma process 43 may be performed at an atmosphere of oxygen. The second plasma process 43 may include a plasma oxidation.

A first interface layer 44U is formed in the upper portion of the bottom electrode 17 through a nitrogen reduction reaction/an oxygen substitution reaction. For example, the first interface layer 44U may be affected by the nitrogen-rich layer 42. A second interface layer 44L is formed in the lower portion of the bottom electrode 17 through an oxidation reaction. The first interface layer 44U and the second interface layer 44L may preferably have the same thickness.

An interface layer 44 having a uniform thickness can be formed on the surface of the bottom electrode 17 by sequentially performing a series of the processes, which include the low-pressure first plasma process 41 and the high-pressure second plasma process 43. The interface layer 44 may include an oxide obtained by oxidizing the surface of the bottom electrode 17. When the bottom electrode 17 includes a metal nitride, the interface layer 44 may be a metal oxide. When the bottom electrode 17 includes a titanium nitride, the interface layer 44 may be a titanium oxide ($TiO_2$).

In some embodiments, the first interface layer 44U may be formed in a portion of the upper bottom electrode 17U that does not contact the second supporter S2. In other words, the first interface layer 44U may not be formed on the interface between the bottom electrode 17 and the second supporter S2. The second interface layer 44L may be formed in a portion of the lower bottom electrode 17L that does not contact the first supporter S1. In other words, the second interface layer 44L may not be formed on the interface between the bottom electrode 17 and the first supporter S1.

Although not illustrated, the surfaces of the first supporter S1 and the second supporter S2 may be oxidized through the second plasma process 43.

Referring to FIG. 11, a dielectric layer 22 may be formed. The dielectric layer 22 may be formed over the interface layer 44. The dielectric layer 22 may be able to cover the etch stop layer 14, the first supporter S1, and the second supporter S2.

After the dielectric layer 22 is formed, a top electrode 23 may be formed over the dielectric layer 22.

FIGS. 12A to 12G illustrate a fourth example of a method for fabricating the semiconductor device in accordance with an embodiment of the present invention. For the sake of convenience in description, as for a method for forming a lower structure 200L disposed in the lower portion of a capacitor 300 among the constituent elements of the semiconductor device 200 shown in FIGS. 8A to 8C, known methods may be referred to.

Figure 12A:
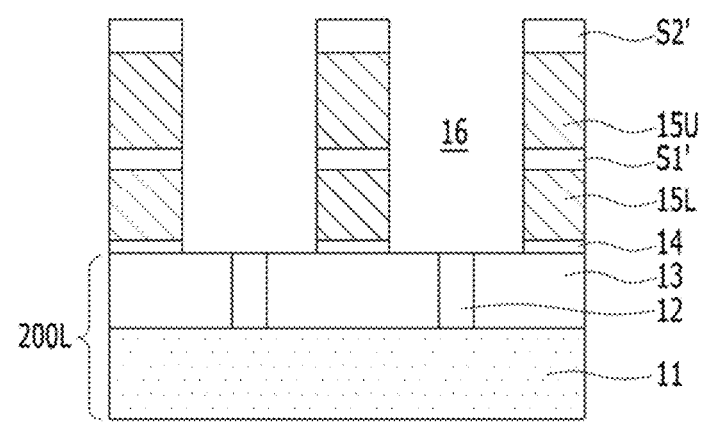
FIGS. 12A to 12G illustrate a fourth example of a method for fabricating the semiconductor device in accordance with an embodiment of the present invention.

Referring to FIG. 12A, an etch stop layer 14 may be formed over the lower structure 200L. A first mold layer 15L, a first supporter layer S1', a second mold layer 15U, and a second supporter layer S2' may be stacked over the etch stop layer 14. The first mold layer 15L and the second mold layer 15U may include a dielectric material. The first mold layer 15L and the second mold layer 15U may include a silicon oxide. The first mold layer 15L and the second mold layer 15U may be formed of different silicon oxides. The first supporter layer S1' and the second supporter layer S2' may be formed of a material having etch selectivity with respect to the first mold layer 15L and the second mold layer 15U. The first supporter layer S1' and the second supporter layer S2' may include a silicon nitride, a silicon carbonitride (SiCN), or a combination thereof.

The etch stop layer 14 may be formed of a material having an etch selectivity with respect to the first mold layer 15L and the second mold layer 15U. The etch stop layer 14 may include a silicon nitride.

Subsequently, an opening 16 may be formed. The opening 16 may be formed by etching the second supporter layer S2', the second mold layer 15U, the first supporter layer S1', and the first mold layer 15L. An etch process for forming the opening 16 may stop at the etch stop layer 14. The opening 16 may be referred to as a hole where a bottom electrode (or a storage node) is to be formed. The opening 16 may have a high aspect ratio. The opening 16 may have an aspect ratio of at least approximately 1:1. For example, the opening 16 may have a high aspect ratio of approximately 1:10 or higher.

Subsequently, the upper surface of the storage node contact structure 12 below the opening 16 may be exposed by etching the etch stop layer 14.

Figure 12B:
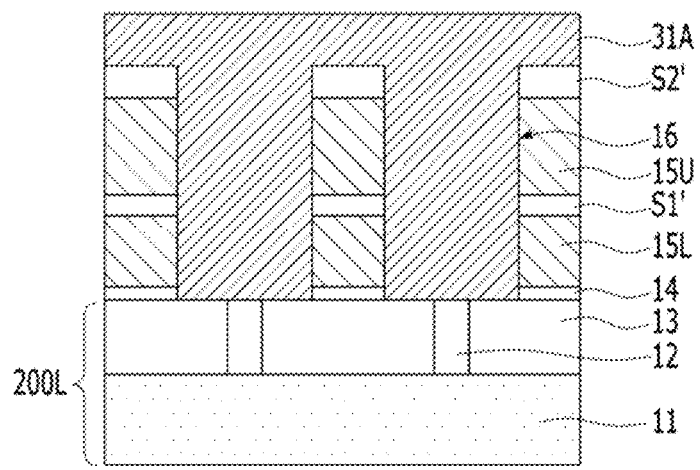

Referring to FIG. 12B, a bottom electrode layer 31A may be formed in the inside of the opening 16. The bottom electrode layer 31A may fill the inside of the opening 16. The bottom electrode layer 31A may be formed over the second supporter layer S2' while filling the inside of the opening 16. The bottom electrode layer 31A may include a metal, a metal nitride, or a combination thereof. The bottom electrode layer 31A may include at least one selected from a group including titanium (Ti), a titanium nitride (TiN), tantalum (Ta), a tantalum nitride (TaN), a titanium aluminum nitride (TiAlN), tungsten (W), a tungsten nitride (WN), ruthenium (Ru), a ruthenium oxide ($RuO_2$), iridium (Ir), an iridium oxide ($IrO_2$), platinum (Pt), and a combination thereof. In some embodiments, the bottom electrode layer 31A may include a titanium nitride (TiN). In some embodiments, the bottom electrode layer 17A may include a titanium nitride that is formed through an Atomic Layer Deposition process (ALD-TiN). The bottom electrode layer 31A may be a titanium nitride having a stoichiometric composition ratio. The stoichiometric composition ratio may be a composition ratio of nitrogen to titanium, which may be approximately 1:1.

Figure 12C:
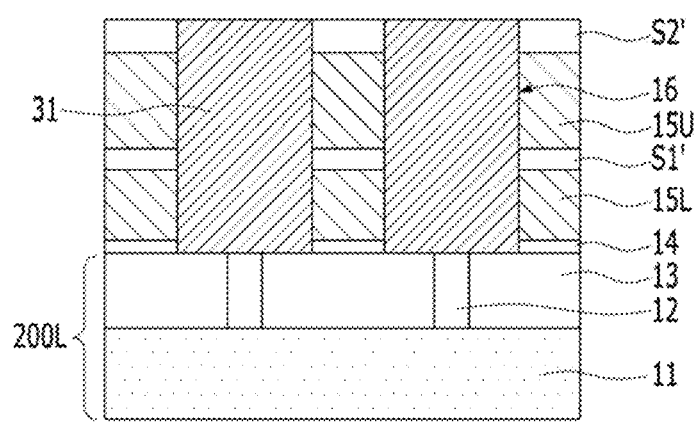

Referring to FIG. 12C, a bottom electrode 31 may be formed. The bottom electrode 31 may be disposed inside of the opening 16. The bottom electrode 31 may be formed by performing a selective etch process onto the bottom electrode layer 31A. The selective etch process may be a Chemical Mechanical Polishing (CMP) process or an etch-back process. For example, the Chemical Mechanical Polishing (CMP) process may be performed onto the bottom electrode layer 31A until the surface of the mold layer 15 is exposed.

The bottom electrode 31 may have a pillar shape filling the inside of the opening 16. The bottom electrode 31 may be electrically connected to the storage node contact structure 12.

Figure 12D:
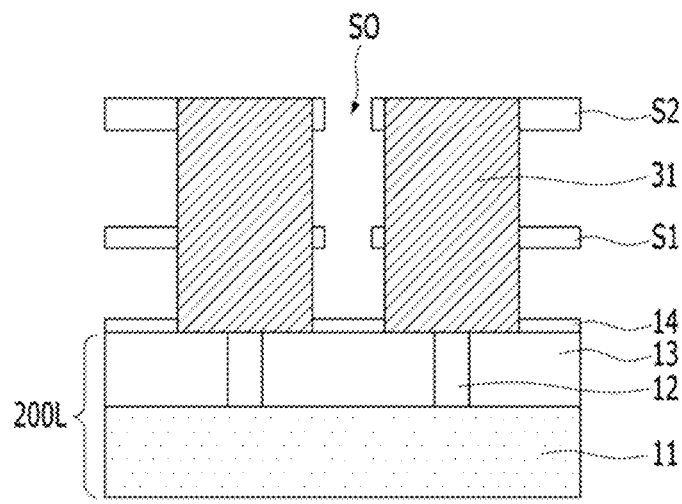

Referring to FIG. 12D, a second supporter S2 and a first supporter S1 may be formed. The second supporter S2 and the first supporter S1 may be formed by selectively etching the second supporter layer S2' and the first supporter layer S1'. For example, a supporter opening S0 and the second supporter S2 may be formed by etching the second supporter layer S2', and a second mold layer 15U may be removed through the supporter opening S0. Subsequently, after the first supporter S1 is formed by etching the first supporter layer Sit, a first mold layer 15L may be removed. The second mold layer 15U and the first mold layer 15L may be removed through a wet dip-out process. The second supporter S2 may be formed on one sidewall of the bottom electrode 31 to contact one sidewall of another neighboring bottom electrode 31. Therefore, the second supporter S2 may be able to support the upper portions of a plurality of neighboring bottom electrodes 31. The first supporter S1 may be formed on one sidewall of the bottom electrode 31 to contact one sidewall of another neighboring bottom electrode 31. Therefore, the first supporter S1 may be able to support the lower portions of the bottom electrodes 31. The etch stop layer 14 may be exposed, as the first mold layer 15L and the second mold layer 15U are removed.

Since the first mold layer 15L and the second mold layer 15U are removed, all the external walls of the bottom electrode 31 may be exposed. The surrounding area of the bottom of the bottom electrode 31 may be supported by the etch stop layer 14.

The bottom electrode 31 may have a high aspect ratio. The bottom electrode 31 may have the same aspect ratio as the opening 16. For example, the bottom electrode 31 may have a high aspect ratio of approximately 1:10 or higher.

The first supporter S1 and the second supporter S2 may increase the structural stability of the bottom electrode 31.

As such, the supporters may have a structure of two layers. Alternatively, the supporters may have a multi-layer structure of more than three layers.

Figure 12E:
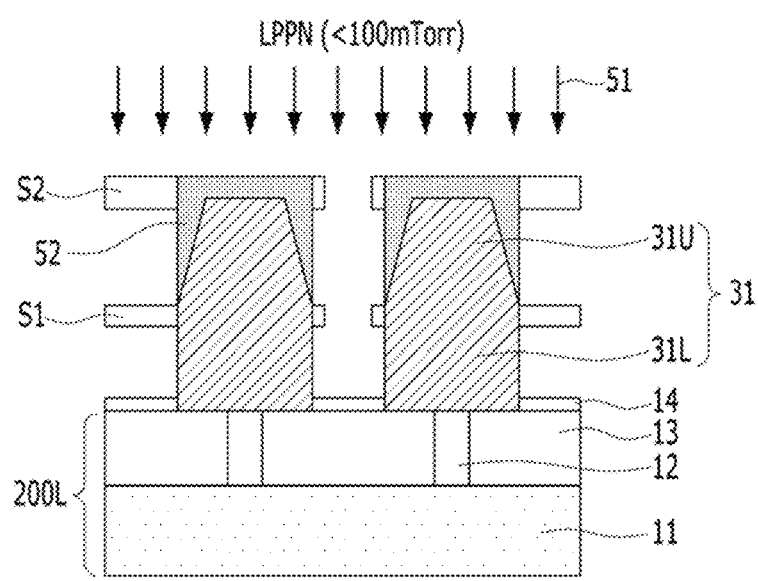

Referring to FIG. 12E, a nitrogen-rich layer 52 may be formed through a first plasma process 51. The first plasma process 51 may correspond to the first plasma process 131 and 131P of FIGS. 2A and 5 respectively. The first plasma process 51 may be performed at a low pressure. The first plasma process 51 may include a low pressure plasma nitridation (LPPN). The first plasma process 51 may be performed in the atmosphere of a nitrogen-containing gas at a low pressure. For example, the first plasma process 51 may be performed using a nitrogen gas ($N_2$) or an ammonia ($NH_3$) gas at a pressure of approximately 100 mTorr or lower.

In some embodiments, when the first plasma process 51 is performed in the atmosphere of nitrogen at a low pressure, the highly reactive nitrogen ion plasma may be bombarded into the upper portion of the bottom electrode 31. As a result of the first plasma process 51, the nitrogen-rich layer 52 may be formed. For example, when the bottom electrode 31 is formed of a titanium nitride, the nitrogen-rich layer 52 may include a nitrogen-rich titanium nitride (N-rich $Ti_xN_y$). The bottom electrode 31 may include a lower bottom electrode 31L and an upper bottom electrode 31U. The upper bottom electrode 31U may not be completely transformed into the nitrogen-rich layer 52. The nitrogen-rich layer 52 can be formed on the surface of the upper bottom electrode 31U. The lower bottom electrode 31L is not affected by the plasma process. In short, the lower bottom electrode 31L may not include the nitrogen-rich layer 52.

The nitrogen-rich layer 52 is locally formed in the upper bottom electrode 31U through the first plasma process 51. Due to the nitrogen-rich layer 52, the bottom electrode 31 may have a changing (i.e., a non-uniform) nitrogen profile. The lower bottom electrode 31L may remain as a titanium nitride, and the upper bottom electrode 31U may include a titanium nitride and a nitrogen-rich titanium nitride that are mixed together. Therefore, the upper bottom electrode 31U and the lower bottom electrode 31L may be formed of a titanium nitride of different nitrogen contents. In addition, the upper bottom electrode 31U may be formed of a nitrogen-rich titanium nitride, and the lower bottom electrode 31L may be formed of a titanium nitride having a stoichiometric composition ratio.

Figure 12F:
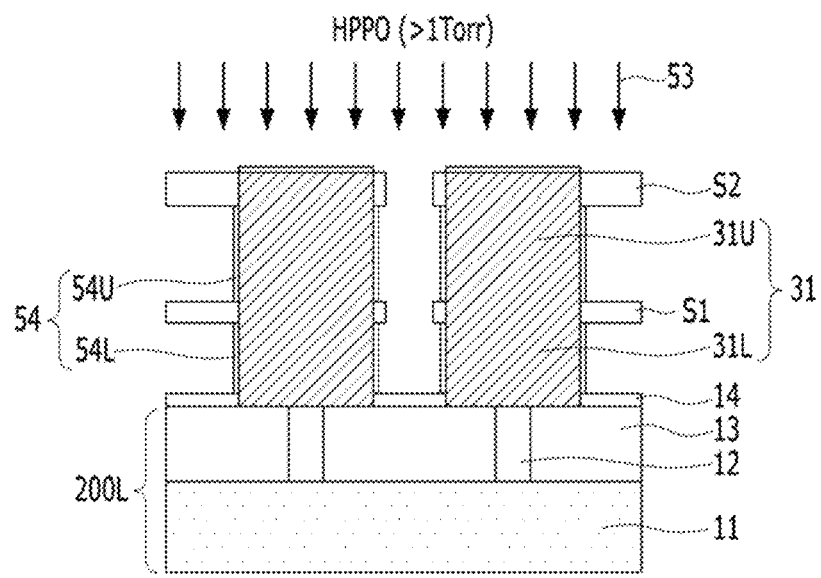

Referring to FIG. 12F, an interface layer 54 may be formed by performing a second plasma process 53. The second plasma process 53 may correspond to the second plasma process 133 of FIG. 2C. The second plasma process 53 may be performed at a higher pressure than the first plasma process 51 is performed. For example, the second plasma process 53 may be performed at a pressure that is higher by approximately 1 torr. The second plasma process 53 may be performed at an atmosphere of oxygen. The second plasma process 53 may include a plasma oxidation.

A first interface layer 54U is formed in the upper bottom electrode 31U through a nitrogen reduction reaction an oxygen substitution reaction. A second interface layer 54L is formed in the lower bottom electrode 31L through an oxidation reaction. The first interface layer 54U and the second interface layer 54L may preferably have the same thickness.

An interface layer 54 having a uniform thickness can be formed on the surface of the bottom electrode 31 by sequentially performing a series of the processes, which include the low-pressure first plasma process 51 and the high-pressure second plasma process 53. The interface layer 54 may include an oxide obtained by oxidizing the surface of the bottom electrode 31. When the bottom electrode 31 includes a metal nitride, the interface layer 54 may be a metal oxide. When the bottom electrode 31 includes a titanium nitride, the interface layer 54 may include a titanium oxide ($TiO_2$).

In some embodiments, the first interface layer 54U may be formed in a portion of the upper bottom electrode 31U that does not contact the second supporter S2. In other words, the first interface layer 54U may not be formed on the interface between the bottom electrode 31 and the second supporter S2.

The second interface layer 54L may be formed in a portion of the lower bottom electrode 31L that does not contact the first supporter S1. In other words, the second interface layer 54L may not be formed on the interface between the bottom electrode 31 and the first supporter S1.

Although not illustrated, the surfaces of the first supporter S1 and the second supporter S2 may be oxidized through the second plasma process 53.

Figure 12G:
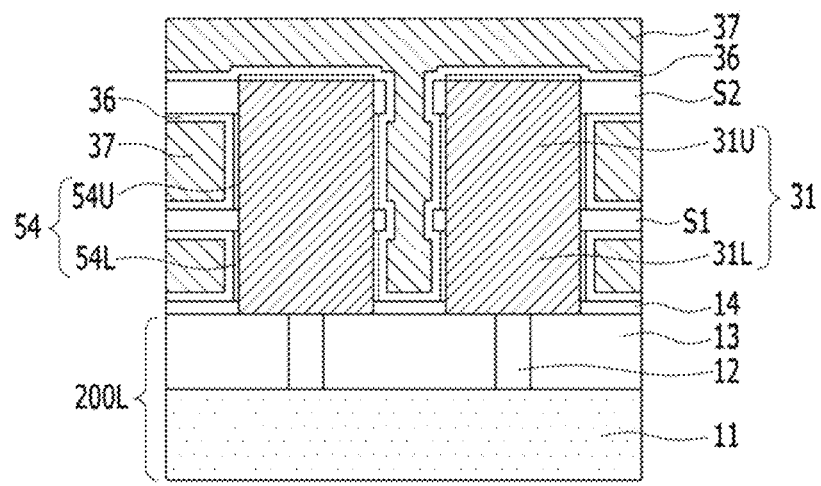

Referring to FIG. 12G, a dielectric layer 36 may be formed over the interface layer 54. The dielectric layer 36 may be able to cover the etch stop layer 14, the first supporter S1, and the second supporter S2.

After the dielectric layer 36 is formed, a top electrode 37 may be formed over the dielectric layer 36.

According to the embodiments of the present invention as described above, oxygen loss from a dielectric layer may be suppressed so as to increase capacitance by forming an interface layer of an oxide which is thin and has a uniform thickness on top of a bottom electrode of a high aspect ratio.

According to the embodiments of the present invention, defects may be decreased due to the presence of a stable interface layer, thus increasing the reliability of a capacitor.

According to the embodiments of the present invention, it is possible to suppress the collapse and/or deformation of a bottom electrode and the generation of a bridge between bottom electrodes by uniformly oxidizing the surface of the bottom electrode having a three-dimensional structure.

While the present invention has been described with respect to specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a bottom electrode having a high aspect ratio;
    forming an interface layer by sequentially performing a first plasma process and a second plasma process onto a surface of the bottom electrode;
    forming a dielectric layer over the interface layer; and
    forming a top electrode over the dielectric layer,
    wherein the first plasma process is performed in an ion plasma-dominant atmosphere at a low pressure,
    wherein the second plasma process is performed in a radical plasma-dominant atmosphere at a high pressure.

2. The method of claim 1, wherein the second plasma process is performed at a higher pressure than at a pressure which the first plasma process is performed.

3. The method of claim 1, wherein the second plasma process is performed at a pressure that is higher by approximately 1 Torr, and the first plasma process is performed at a pressure that is lower than approximately 100 mTorr.

4. The method of claim 1, wherein the forming of the interface layer comprises;
    performing the first plasma process in a nitrogen ion plasma-dominant atmosphere at a low pressure, and
    performing the second plasma process in an oxygen radical plasma-dominant atmosphere at a high pressure.

5. The method of claim 1, wherein the first plasma process includes a low-pressure plasma nitridation, and
    the second plasma process includes a high-pressure plasma oxidation.

6. The method of claim 1, wherein the bottom electrode includes a cylindrical shape having an aspect ratio of at least approximately 1:10 or higher.

7. The method of claim 1, wherein the bottom electrode includes a pillar shape having an aspect ratio of at least approximately 1:10 or higher.

8. The method of claim 1, wherein the bottom electrode includes a lower bottom electrode and an upper bottom electrode, and
    the first plasma process locally nitridizes a surface of the upper bottom electrode, and
    the second plasma process oxidizes the lower bottom electrode and the nitridized surface of the upper bottom electrode.

9. The method of claim 1, wherein the bottom electrode includes a metal nitride.

10. The method of claim 1, wherein the bottom electrode includes a titanium nitride or a tantalum nitride.

11. The method of claim 1, wherein the interface layer includes a metal oxide.

12. The method of claim 1, wherein the interface layer includes a titanium oxide or a tantalum oxide.

13. The method of claim 1, wherein the dielectric layer includes ZAZ ($ZrO_2/Al_2O_3/ZrO_2$) or HAH ($HfO_2/Al_2O_3/HfO_2$).

14. A method for fabricating a semiconductor device, comprising:
    forming a mold layer over a lower structure;
    forming an opening by etching the mold layer;
    forming a bottom electrode including a metal nitride inside the opening;
    exposing the bottom electrode by removing the mold layer;
    forming an interface layer over the bottom electrode by sequentially exposing the bottom electrode to a low-pressure plasma nitridation process and a high-pressure plasma oxidation process;
    forming a dielectric layer over the interface layer; and
    forming a top electrode over the dielectric layer.

15. The method of claim 14, wherein the low-pressure plasma nitridation process is performed in a nitrogen ion plasma-dominant atmosphere at a low pressure, and
    the high-pressure plasma oxidation process is performed in an oxygen radical plasma-dominant atmosphere at a high pressure.

16. The method of claim 14, wherein the high-pressure plasma oxidation process is performed at a pressure that is higher by approximately 1 Torr, and the low-pressure plasma nitridation process is performed at a pressure that is lower than approximately 100 mTorr.

17. The method of claim 14, wherein the bottom electrode includes a cylindrical shape or a pillar shape having an aspect ratio of at least approximately 1:10 or higher.

18. The method of claim 14, wherein the bottom electrode includes a titanium nitride or a tantalum nitride.

19. The method of claim 14, wherein the interface layer includes a titanium oxide or a tantalum oxide.

* * * * *